US012685033B2

(12) United States Patent
Miyazaki et al.

(10) Patent No.: US 12,685,033 B2
(45) Date of Patent: Jul. 14, 2026

(54) SUPERCONDUCTING QUANTUM CIRCUIT

(71) Applicant: NEC Corporation, Tokyo (JP)

(72) Inventors: Ryoji Miyazaki, Tokyo (JP); Aiko Yamaguchi, Tokyo (JP); Tomohiro Yamaji, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/851,131

(22) PCT Filed: Mar. 29, 2022

(86) PCT No.: PCT/JP2022/015706
§ 371 (c)(1),
(2) Date: Sep. 26, 2024

(87) PCT Pub. No.: WO2023/188041
PCT Pub. Date: Oct. 5, 2023

(65) Prior Publication Data
US 2025/0301922 A1 Sep. 25, 2025

(51) Int. Cl.
*H10N 69/00* (2026.01)
*G06N 10/20* (2022.01)
(Continued)

(52) U.S. Cl.
CPC ............. *H10N 69/00* (2023.02); *G06N 10/20* (2022.01); *G06N 10/40* (2022.01); *H10N 60/12* (2023.02);
(Continued)

(58) Field of Classification Search
CPC ...... H10N 69/00; H10N 60/12; H10N 60/805; H10N 60/82; G06N 10/20; G06N 10/40; H03K 17/92
(Continued)

(56) References Cited

U.S. PATENT DOCUMENTS

| | | | |
|---|---|---|---|
| 10,262,276 B2 | 4/2019 | Puri et al. | |
| 11,791,818 B2 * | 10/2023 | Mundhada | G06N 10/40 |
| | | | 327/528 |

(Continued)

FOREIGN PATENT DOCUMENTS

| | | |
|---|---|---|
| JP | 2018-529142 A | 10/2018 |
| JP | 2021-516389 A | 7/2021 |

(Continued)

OTHER PUBLICATIONS

European Search Report for EP Application No. 22935189.5, dated on Apr. 22, 2025.

(Continued)

*Primary Examiner* — Arnold M Kinkead
(74) *Attorney, Agent, or Firm* — Sughrue Mion, PLLC

(57) ABSTRACT

A superconducting quantum circuit includes first to fourth qubits, and a coupler including first and second electrodes and a nonlinear element bridging the first and second electrodes, wherein each of the first to fourth qubits includes a resonator including a SQUID loop circuit and a capacitor connected in parallel to the loop circuit, the first and second qubits and the third and fourth qubits capacitively coupled to the first and second electrodes of the coupler, respectively, wherein a magnitude relationship among a capacitance value C of a capacitive coupling between each of the first to fourth qubits and the coupler, a capacitance value $C_J$ of the capacitor connected in parallel to the loop circuit for each of the first to fourth qubits, and a capacitance value $C_g$ between the first and second electrodes of the coupler, is set to $C_J > C_g > C$.

12 Claims, 11 Drawing Sheets

(51) Int. Cl.

| | | |
|---|---|---|
| *G06N 10/40* | (2022.01) | |
| *H03K 17/92* | (2006.01) | |
| *H10N 60/12* | (2023.01) | |
| *H10N 60/80* | (2023.01) | |
| *H10N 60/82* | (2023.01) | |

(52) U.S. Cl.
CPC .......... *H10N 60/805* (2023.02); *H10N 60/82* (2023.02); *H03K 17/92* (2013.01)

(58) Field of Classification Search
USPC .............................. 326/1; 327/528, 527, 524
See application file for complete search history.

(56) References Cited

U.S. PATENT DOCUMENTS

| | | |
|---|---|---|
| 2018/0218279 A1 | 8/2018 | Lechner et al. |
| 2018/0341874 A1 | 11/2018 | Puri et al. |
| 2019/0294991 A1 | 9/2019 | Filipp et al. |
| 2020/0091867 A1* | 3/2020 | Goto .................... H03B 15/003 |
| 2021/0263705 A1 | 8/2021 | Kanao et al. |
| 2021/0326737 A1 | 10/2021 | Jin et al. |
| 2022/0247407 A1 | 8/2022 | Yamamoto et al. |
| 2022/0261676 A1 | 8/2022 | Yamamoto et al. |
| 2022/0318660 A1 | 10/2022 | Hasegawa et al. |

FOREIGN PATENT DOCUMENTS

| | | |
|---|---|---|
| JP | 2021-132188 A | 9/2021 |
| JP | 2021-175178 A | 11/2021 |
| WO | 2017/001404 A1 | 1/2017 |
| WO | 2021/014885 A1 | 1/2021 |
| WO | 2021/014889 A1 | 1/2021 |
| WO | 2021/014891 A1 | 1/2021 |

OTHER PUBLICATIONS

Shruti Puri et al., "Quantum annealing with a network of all-to-all connected, two-photon driven Kerr nonlinear oscillators", arxiv.org, Sep. 22, 2016 (Sep. 22, 2016), XP080813092, pp. 1-9.

Hayato Goto, "Quantum computation Based on Quantum Adiabatic Bifurcations of Kerr-Nonlinear Parametric Oscillators", arxiv.org, Aug. 31, 2018 (Aug. 31, 2018), XP081102940, pp. 1-14, DOI: 10.48550/arXiv.1808.10609.

Tomohiro Yamaji et al., "Development of Quantum Annealer Using Josephson Parametric Oscillators", IEICE Transactions on Electronics, vol. E105.C, No. 6, Dec. 3, 2021 (Dec. 3, 2021), XP093266582, pp. 283-289, DOI: 10.1587/transele.2021SEP0006.

International Search Report for PCT Application No. PCT/JP2022/015706, mailed on Jun. 21, 2022.

Puri, et al., "Quantum annealing with all-to-all connected nonlinear oscillators", Nature Communications 8, 15785 (2017).

U. Vool et al., "Introduction to Quantum Electromagnetic Circuits", International Journal of Circuit Theory and Applications 45, 897 (2016), arXiv:1610.03438v2 [quant-ph] Jun. 9, 2017.

Wang et al., "Quantum Dynamics of a Few-Photon Parametric Oscillator", Physical Review X 9, 021049 (2019).

Peng Zhao et al., "Two-photon driven Kerr resonator for quantum annealing with three-dimensional circuit QED", DOI:10.1103/PhysRevApplied.10.024019, arXiv:1712.03613v2 [quant-ph] Dec. 12, 2017.

* cited by examiner

PRIOR ART

SUPERCONDUCTING QUANTUM CIRCUIT

This application is a National Stage Entry of PCT/JP2022/015706 filed on Mar. 29, 2022, the contents of all of which are incorporated herein by reference, in their entirety.

FIELD

The present disclosure relates to a superconducting quantum circuit.

BACKGROUND

There is quantum annealing as an approach for solving combinatorial optimization problems and, as one of quantum annealing schemes, there is one called an LHZ (Lechner, Hauke, Zoller) scheme (e.g. reference may be made to Patent Literature (PTL) 1). In order to physically implement quantum annealing of the LHZ scheme, it is necessary to implement quantum bits (qubits) each of which is a basic element, and a network thereof, in particular, a network in which four qubits interact with each other simultaneously (four-body interaction).

As one of implementation modes, there have been proposed a technique (approach) using a Josephson parametric oscillator (JPO) as a qubit (e.g. reference may be made to Non-Patent Literature (NPL) 1, PTL 3, etc.)

(a) One approach, as illustrated in FIG. 1A, while using a simple structure, is enabled to implement a four-body interaction. FIG. 1A is a diagram based on a diagram a of FIG. 4 of NPL 1. FIG. 1A illustrates a system in which JPO1 to JPO4 with respective resonance angular frequencies $\omega_{r,\ i}$ (i=1, 2, 3, 4) interact via a single Josephson junction (JJ) (JPO1 to JPO4 with different resonance angular frequencies are illustrated with different patterns according to FIG. 4 of NPL 1).

SQUID (Superconducting Quantum Interference Device) loop of each JPO is driven by a flux pump whose amplitude and frequency can be adjusted. An angular frequency $\omega_{p,\ k}$ (t)(k=1, 2, 3, 4) of a pump signal is close to $2\omega_{r,\ i}$, which is twice an angular frequency of a resonator. In a Josephson Parametric Amplifier (JPA), there is a certain threshold for a strength of a pump, wherein when the strength of the pump exceeds the threshold, the JPA begins to oscillate and outputs a signal with a resonance angular frequency $\omega_{r,\ i}$ even with no input signal. This is called a parametric oscillation. In the present specification, since a resonator is directed to one with parametric oscillation, in FIG. 1A, the JPA in FIG. 4 of NPL 1 is denoted as JPO.

Local four-body coupling is realized through a nonlinear inductance of the Josephson junction JJ disposed at a center (central JJ).

Each angular frequency of pump signals for JPO1 to JPO4 is selected to meet the following condition:

$$\omega_{p,1}(t) + \omega_{p,2}(t) = \omega_{p,3}(t) + \omega_{p,4}(t) \qquad (1.1)$$

and the resonator is made to be detuned. When detuned each other, the Josephson junction JJ (central JJ) at a center induces a coupling of the following form in a rotating coordinate system of the two-photon drives:

$$-C(a_1^+ a_2^+ a_3 a_4 + a_4^+ a_3^+ a_2 a_1) \qquad (1.2)$$

This four-body interaction is always active, and a strength G thereof depends on a non-linearity of the Josephson junction (JJ) and detuning between the JPO(s) and the resonator including the Josephson junction. It is noted that $a_i$ (i=1~4) is an annihilation operator and $a_i^+$ (i=1~4) is a creation operator of a resonance mode (boson) of the JPO1 to JPO4.

$$G = E_j(\phi_c^4/\phi_0^4)\{(g_1\ g_2\ g_3\ g_4)/(\Delta_1\ \Delta_2\ \Delta_3\ \Delta_4)\} \qquad (1.3)$$

In Equation (1.3), $\Delta_k$ (k=1, 2, 3, 4) is a difference (detuning) between a mode angular frequency $\omega_{r,\ k}$ of k-th JPO and a mode angular frequency (resonance angular frequency) $\omega_c$, which is defined by a capacitance and inductance of the central Josephson junction JJ.

$$\Delta_k = \omega_c - \omega_{r,k}\ (k = 1, 2, 3, 4) \qquad (1.4)$$

$\phi_0$=(h/2π)(2e) is a magnetic flux quantum (e is an electric elementary charge) and $\phi_c$ is a standard deviation of a zero-point magnetic flux variation in a JJ mode.

$E_J$ is a central Josephson energy and takes a value proportional to a critical current Ic of the Josephson junction.

$g_k$ (k=1, 2, 3, 4) is a magnitude of coupling between the k-th JPO and a mode of the Josephson junction of a central coupler.

$$g_k = \phi_0^2 e^2/2C\phi_c\phi_k \qquad (1.5)$$

where $\phi_k$ (k=1, 2, 3, 4) is a zero-point magnetic flux variation in a JPO mode, and C is a capacitance value of a coupling capacitor between a coupler and a qubit.

In NPL 1, C is used as a four-body interaction strength (four-body coupling strength) in Equations (1.2) and (1.3), but here, G is used for distinction from coupling capacitor C.

In NPL1, it is not clear how to strengthen the four-body interaction with respect to a configuration in FIG. 1A.

(b) The other approach uses a Josephson Ring Modulator (JRM), as illustrated in FIG. 1B. FIG. 1B is a diagram based on Supplementary FIG. 8 of NPL 1. In FIG. 1B, JPA in Supplementary FIG. 8 of Supplementary Note 8 of NPL 1 is denoted as JPO. Microwave drive signals with equal signal strength but opposite phase (as shown with solid and dashed arrows for capacitors $C_x$ and $C_y$) trigger four-body coupling among the JPOs. A tunable four-body interaction is implemented by using an imbalanced shunted Josephson Ring Modulator (JRM). JRM includes two pairs of Josephson Junctions (JJs). In each pair, the Josephson junctions are connected in series. The two pairs of Josephson junctions are connected in parallel between a first node and a second node, where the first node is a connection node of JPO1 and JPO2, and the second node is a connection node of JPO3 and JPO4. Microwave drive signals are applied to the first and second nodes via the capacitors $C_x$, respectively, and microwave drive signals each having an opposite phase of the microwave drive signals applied to the capacitors $C_x$ are applied via capacitors $C_y$ to each junction of the two sets of Josephson Junctions (JJs) connected in parallel.

In this case, to implement a four-body interaction, when a combination of oscillation angular frequencies that the JPO1 to JPO4 should meet and an angular frequency $\omega_d$ of drive signals input from the capacitors $C_x$ and $C_y$, for example, is given as $$\omega_d = \omega_{p,1} + \omega_{p,2} + \omega_{p,3} - \omega_{p,4} \qquad (1.6)$$

the Hamiltonian is derived as the following equation for the drive signal given as:

$$2\Phi_Z\left(\sqrt{n}\right)\cos(\omega_d t) \qquad (1.7)$$

$$H_{plaquette} \approx \Sigma < k = 1, \qquad (1.8)$$

$$4 > \left[H_{JPO,k} - \left\{(g_k^x)^2/\Delta_k^x\right\}a_k^+ a_k\right] - C_{jrm}(a_1^+ a_2^+ a_3^+ a_4 + a_4^+ a_3 a_2 a_1)$$

where $$C_{jrm} = E_J\left(\sqrt{n}\right)\left\{\phi x^4 \phi z/(4\phi_0^5)\right\}(g_1\, g_2\, g_3\, g_4)/(\Delta_1\, \Delta_2\, \Delta_3\, \Delta_4) \qquad (1.9)$$

The second term on the right side of Equation (1.8) is a four-body interaction term. $\sqrt{n}$ is proportional to a strength of a microwave drive.

As a configuration of a related technology similar to FIG. 1A, Patent Literature (PTL) 2, for example, discloses a circuit that uses a lumped element type JPO, as illustrated in FIG. 2. The circuit includes four JPO1 (120A) to JPO4 (120D) and a coupler 121. Coupler connection portions 124A to 124D of the JPO1 (120A) to JPO4 (120D) and the coupler 121, which includes a Josephson junction (JJ), are capacitively coupled via capacitors (coupling capacitors) 131A to 131D, respectively. Readout circuit connection portions 122A to 122D of JPO1 (120A) to JPO4 (120D) are capacitively coupled to readout circuits 140A to 140D via capacitors 132A to 132D, respectively. JPO1 (120A) to JPO4 (120D) are connected to signal generation parts 150A to 150D via control lines 123A to 123D, respectively. The signal generation parts 150A to 150D generate pump signals to generate magnetic fluxes through SQUID loops of JPO1 (120A) to JPO4 (120D). A nonlinear element 110 of the coupler 121 is an element that can be regarded as an LC resonator with a Josephson junction (JJ) as a nonlinear inductance. The nonlinear element 110 may be a SQUID including two Josephson junctions (JJ).

[PTL 1] International Publication No. WO 2017/001404
[PTL 2] International Publication No. WO 2021/014885
[PTL 3] U.S. Pat. No. 10,262,276 B1
[NPL 1] Puri, et. al., "Quantum annealing with all-to-all connected nonlinear oscillators", Nature Communications 8, 15785 (2017)
[NPL 2] "Introduction to Quantum Electromagnetic Circuits", International Journal of Circuit Theory and Applications 45, 897 (2016)
[NPL 3] Z. Wang et al., "Quantum Dynamics of a Few-Photon Parametric Oscillator", Physical Review X 9, 021049 (2019)

SUMMARY

In NPL 1 and PTL 2, illustrated in FIG. 1A and FIG. 2, there is no reference to an approach to strengthen a four-body interaction. The configuration of FIG. 1B allows the strength of the four-body interaction to be adjusted but requires another external input (microwave drive signals input in opposite phases to the capacitors $C_x$ and $C_y$).

Accordingly, it is an object of the present disclosure to provide a superconducting quantum circuit enabled to strengthen a four-body interaction by a circuit configuration itself, without requiring any other external input.

According to one of aspects of the present disclosure, there is disclosed a superconducting quantum circuit including first to fourth qubits and a coupler that couples the first to fourth qubits with a four-body interaction, wherein the coupler includes: first and second electrodes arranged opposed to each other; and a nonlinear element including a Josephson junction and bridging the first and second electrodes, wherein each of the first to fourth qubits includes a resonator including: a loop circuit with a first superconducting line, a first Josephson junction, a second superconducting line and a second Josephson junction connected in a ring-shape; and a capacitor connected in parallel to the loop circuit, wherein the first and second qubits are capacitively coupled to the first electrode of the coupler, and the third and fourth qubits are capacitively coupled to the second electrode of the coupler, and wherein a magnitude relationship among a capacitance value C of a capacitive coupling between each of the first to fourth qubits and the coupler, a capacitance value $C_J$ of the capacitor connected in parallel to the loop circuit of each of the first to fourth qubits, and a capacitance value $C_g$ between the first and second electrodes of the coupler is set to $C_J > C_g > C$.

According to the present disclosure, it is possible to provide a superconducting quantum circuit enabled to strengthen a four-body interaction by a circuit configuration itself, without requiring another external input. Still other features and advantages of the present invention will become readily apparent to those skilled in this art from the following detailed description in conjunction with the accompanying drawings wherein only example embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EXAMPLE EMBODIMENTS

Figure 1A:
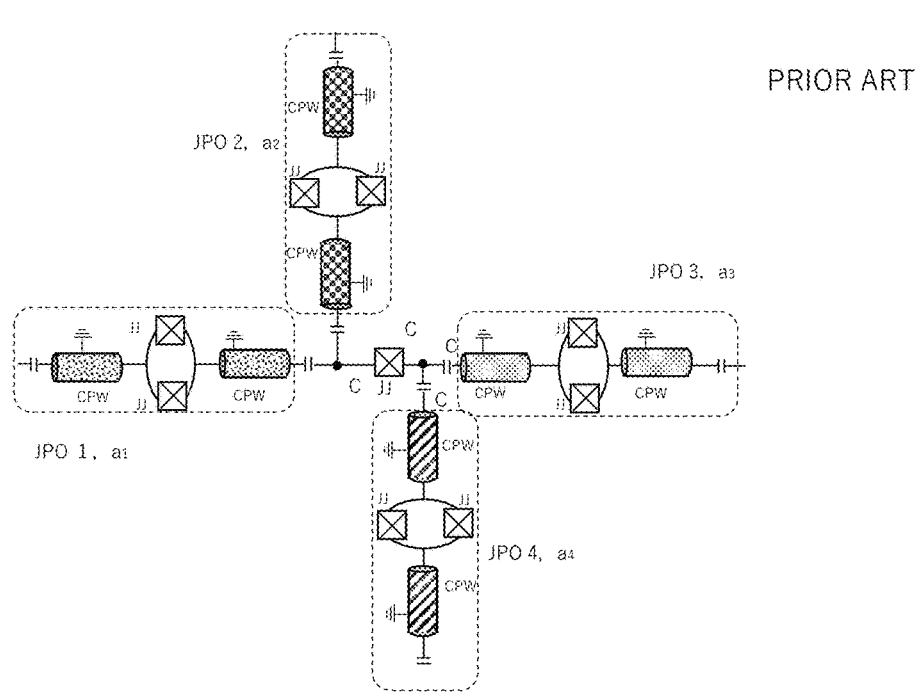
FIG. 1A is a diagram illustrating a related art.
Figure 1B:
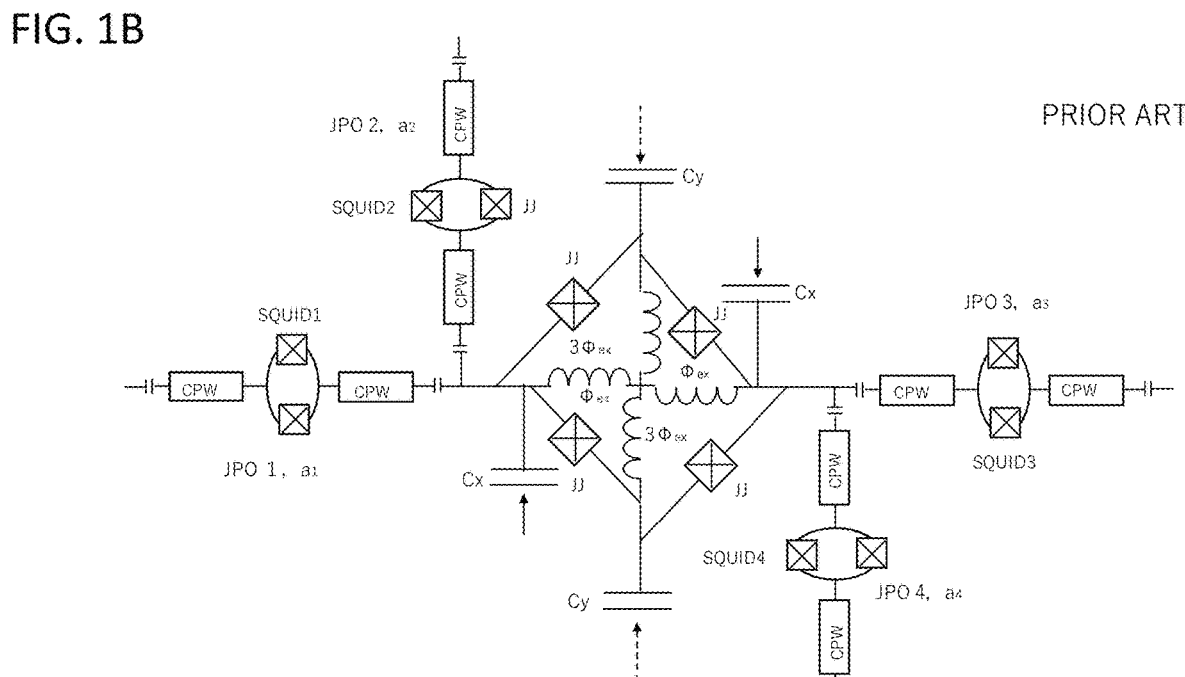
FIG. 1B is a diagram illustrating a related art.
Figure 2:
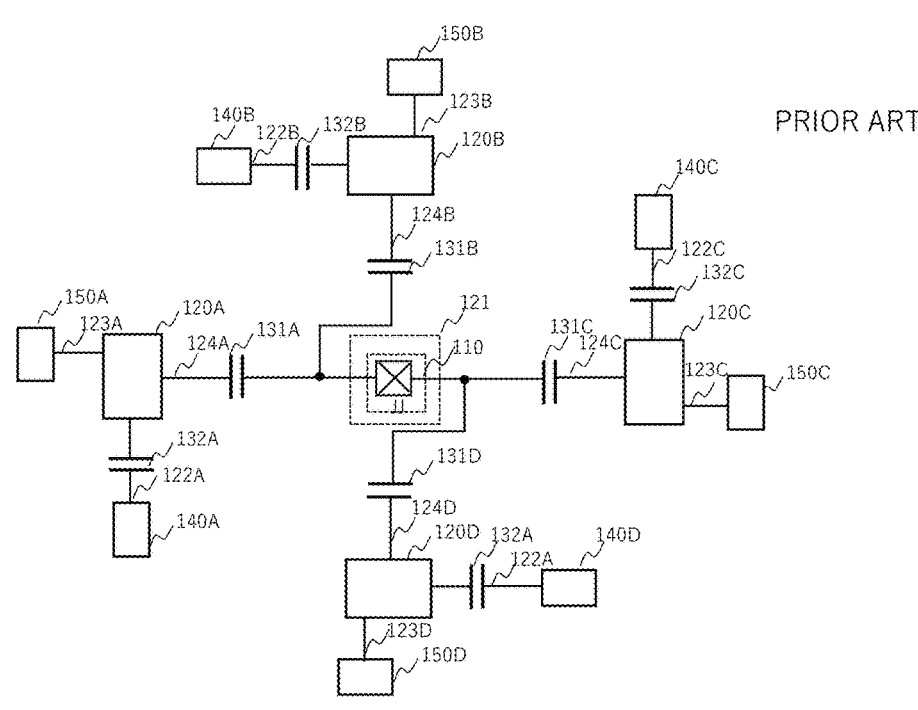
FIG. 2 is a diagram illustrating a related art.
Figure 3:
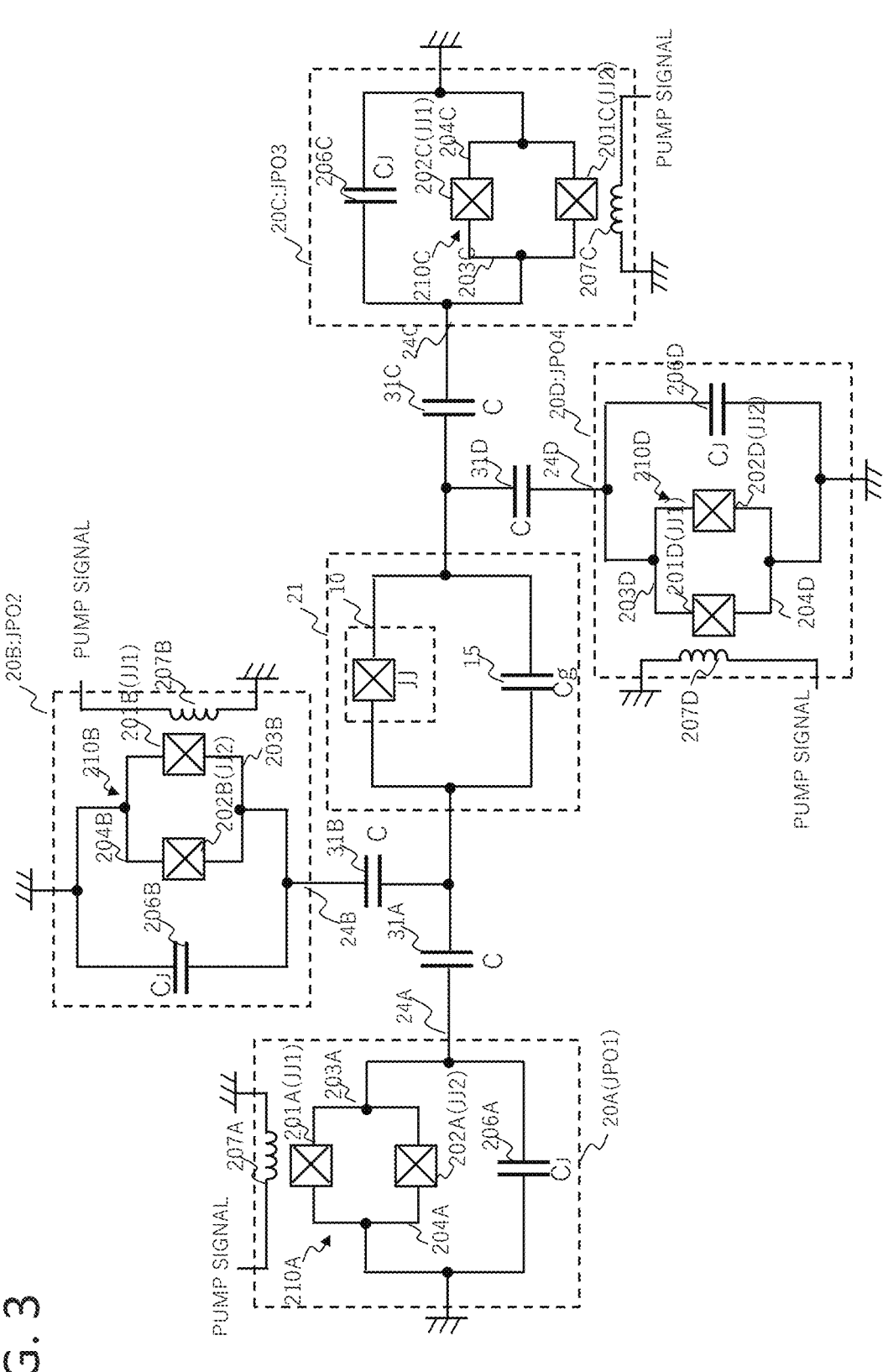
FIG. 3 is a diagram schematically illustrating an example embodiment.

The following describes example embodiments of the present disclosure. In the following description of examples and embodiments, reference is made to the accompanying drawings which form a part hereof, and in which it is shown by way of illustration specific examples that can be practiced. It is to be understood that other examples can be used and structural changes can be made without departing from the scope of the disclosed examples. It is noted that in the disclosure, the expression "at least one of A and B" means A, B, or (A and B). The term expressed as "--(s)" includes both singular and/or plural form. FIG. 3 is a diagram illustrating a circuit configuration of an example embodiment. In FIG. 3, illustration of a readout circuit connected to each JPO illustrated in FIG. 2 is omitted. In the present example embodiment, resonant frequencies of each JPO and a coupler are made close to each other to strengthen a four-body interaction. They are made close to each other in a range that satisfies a condition described below. Also, in the present example embodiment, conditions are imposed on capacitance to prevent from strengthening unnecessary interactions other than the four-body interaction.

The example embodiment provides a condition for a parameter setting to strengthen a circuit parameter dependency of the four-body interaction and the four-body interaction.

Referring to FIG. 3, four JPO1 (20A) to JPO4 (20D) and a coupler 21 are provided. JPO1 (20A) to JPO4 (20D) are connected to the coupler 21 by capacitive coupling through coupling capacitors 31A to 31D, respectively. In the following example embodiment, a lump element type is used for each JPO, but it is of course possible to use a distributed element type.

The coupler 21 includes a nonlinear element 10 that includes a Josephson junction (JJ) and a capacitor 15 connected in parallel to the nonlinear element 10.

JPO1 (20A) to JPO4 (20D) include SQUIDs (SQUID loops) 210A to 210D in which first superconducting portions 203A to 203D, first Josephson junctions 201A to 201D, second superconducting portions 204 A to 204D and second Josephson junctions 202A to 202D are connected in a ring, respectively, magnetic field generators 207A to 207D, and capacitors 206A to 206D, respectively. The magnetic field generators 207A to 207D generate magnetic flux through the SQUID loops 210A to 210D by pump signals supplied to control lines 23A to 23D from signal generation parts (not shown), respectively. The capacitors 206A to 206D are connected between the first superconducting portions 203A to 203D and the second superconducting portions 204A to 204D, respectively. The second superconducting portions 204A to 204D are connected to ground, the first superconducting portions 203A and 203B of JPO1 (20A) and JPO2 (20B) are connected to one end of the coupler 21 via coupling capacitors 31A and 31B, and the first superconducting portions 203C and 203D of JPO3 (20C) and JPO4 (20D) are connected to the other end of the coupler 21 via coupling capacitors 31C and 31D, respectively.

$C_J$ is a capacitance value of each of the capacitors 206A to 206D of JPO1 (20A) to JPO4 (20D), $C_g$ is a capacitance value of the capacitor 15 in the coupler 21, and C is a capacitance value of each of the coupling capacitor 31A through 31D.

Figure 4:
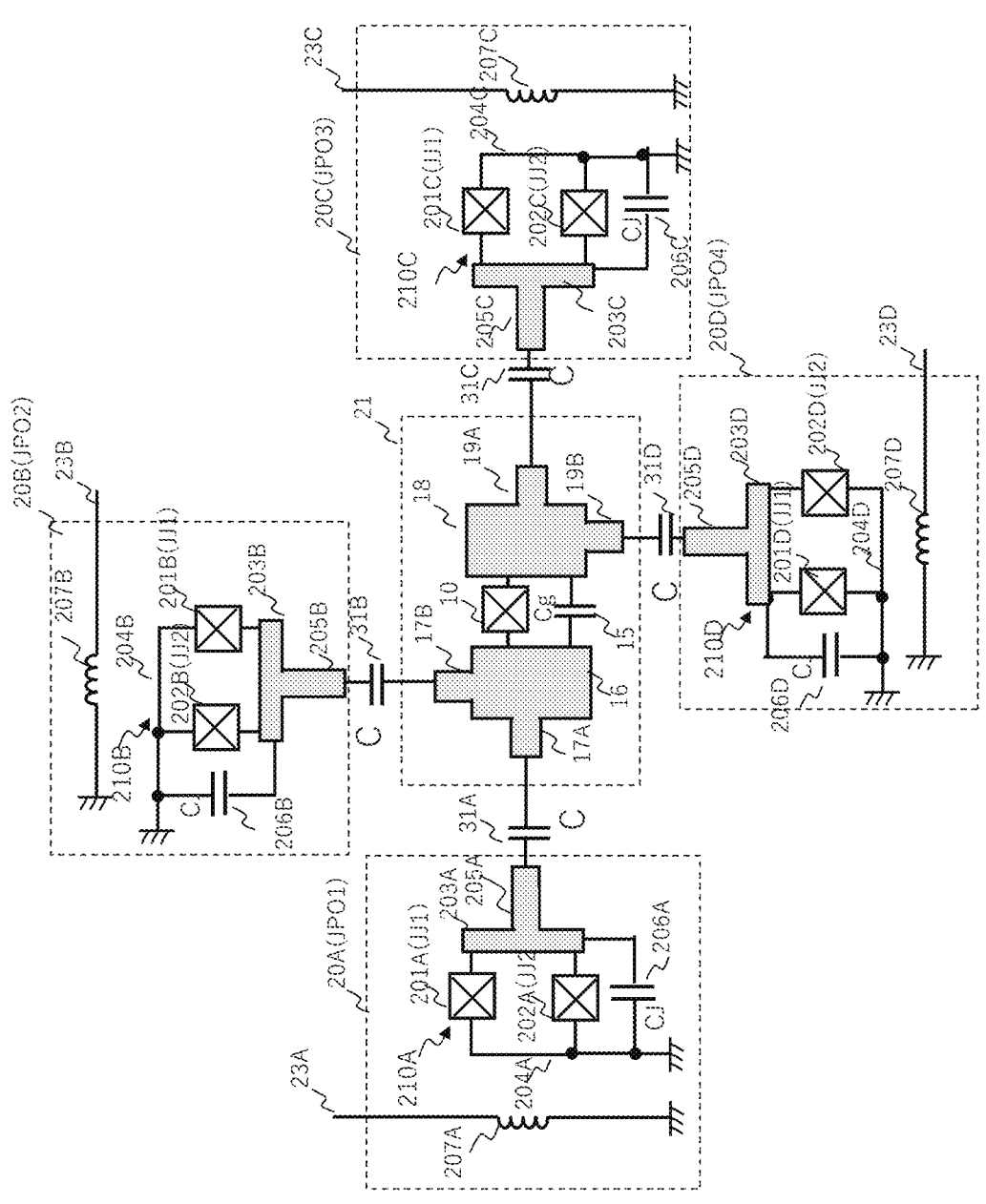
FIG. 4 is a diagram schematically illustrating the example embodiment.

FIG. 4 illustrates a schematic example of a configuration (wiring pattern) of JPO1 to JPO4 and the coupler 21 where JPO1 to JPO4 are made of a lumped element type configuration, as one example of FIG. 3. The coupler 21 includes first and second electrodes 16 and 18 (made of superconducting material) that are bridged by the nonlinear element 10. The first electrode 16 includes first and second opposing portions 17A and 17B (made of superconducting material)

elongated toward JPO1 (20A) and JPO2 (20B), respectively. The second electrode 18 includes third and fourth opposing portions 19A and 19B (made of superconducting material) elongated toward the JPO3 (20C) and JPO4 (20D), respectively. In the coupler 21 in FIG. 4, the capacitor 15, which is shunt-connected (connected in parallel) to the Josephson junction (JJ), corresponds to a capacitance between the first and second electrodes 16 and 18 arranged opposed to each other. In FIG. 4, a ground pattern (ground plane) surrounding the first and second electrodes 16 and 18 is omitted.

JPO1 (20A) to JPO4 (20D) are configured as waveguide resonators that are terminated to ground via the SQUID 210A to 210D, respectively. The waveguide resonator modulates the magnetic flux penetrating through the SQUID loops 210A to 210D by pump signals (microwaves) from control lines 23A to 23D, at about twice the frequency of the resonance frequency. This causes parametric oscillation.

In JPO1 (20A) and JPO2 (20B), end portions of conductive portions (waveguides made of superconducting material) 205A and 205B (corresponding to coupler connection parts 24A and 24B in FIG. 3) connecting to the first superconducting portions 203A and 203B of the SQUIDs 210A and 210B, respectively, are capacitively coupled to end portions of the first and second opposing portions 17A and 17B of the first electrode 16 of the coupler 21, respectively. Capacitance value C of the coupling capacitors 31A and 31B is a capacitance between the end portion of the conductive portions (waveguides) 205A and 205B and the first and second opposing portions 17A and 17B of the first electrode 16 of the coupler 21. In JPO3 (20C) and JPO4 (20D), end portions of conductive portions (waveguides made of superconducting material) 205C and 205D (corresponding to coupler connection parts 24C and 24D in FIG. 3) connecting to the first superconducting portions 203C and 203D of the SQUIDs 210C and 210D, respectively, are capacitively coupled to end portions of the third and fourth opposing portions 19A and 19B of the second electrode 18 of the coupler 21, respectively. Capacitance value C of the coupling capacitors 31C and 31D is a capacitance between the end portion of the conductive portions (waveguides) 205C and 205D and the third and fourth opposing portions 19A and 19B of the second electrode 18 of the coupler 21. Capacitors 206A to 206D of JPO1 (20A) to JPO4 (20D) correspond to a capacitance between the first superconducting portion 203A to 203D of the SQUID 210A to 210D and ground, respectively. In FIG. 4, ground patterns (ground planes) on both sides of the conductive portions (coplanar waveguides) 205A to 205D of JPO1 (20A) to JPO4 (20D) are omitted.

According to the example embodiment, the following relationship is held.

$$C_J > C_g > C \qquad (2.1)$$

By setting a resonance angular frequency $\omega$ of each JPO from JPO1 (20A) to JPO4 (20D) and a resonance angular frequency of the coupler 21 close together, a strength of the four-body interaction (magnitude of coupling constant) is able to be set large.

Derivation of a four-body interaction strength (coupling constant) $g^{(4)}$ for JPO1 (20A) to JPO4 (20D) is outlined below (details will be described later).

Following a standard approach in this field (e.g., NPL 2), a magnetic flux degree of freedom is set in a circuit. One magnetic flux degree of freedom is set for each JPO and two for the coupler. This is used to write down a Hamiltonian for a classical circuit. The Hamiltonian is quantized using a standard method (see NPL 2). The Hamiltonian quantized $H_{total}$ is given as Equation (2.1). In the present specification, the notation of ^H with a hat as a quantized Hamiltonian is not used, as in the case of the PTL 2.

$$H_{total} = \sum_{i=1}^{4} H_{JPO,i} + g_+ \sum_{i=1}^{4} (a_i^+ - a_i)(a_{g_+} - a_{g_+}^+) + \tag{2.2}$$

$$g_- \sum_{i=1}^{4} s_i(a_i^+ - a_i)(a_{g_-} - a_{g_-}^+) + H_{coupler}$$

In Equation (2.2), $H_{JPO,i}$ is a Hamiltonian of each JPOi (i=1, . . . , 4) and $H_{coupler}$ is a Hamiltonian of the coupler 21.

$a_i$ and $a_i^+$ are creation and annihilation operators of boson corresponding to JPOi (i=1, . . . , 4), respectively (in the present specification, no hat is attached to the creation and annihilation operators either).

Since the coupler 21 has two magnetic flux degrees of freedom, the coupler 21 has two modes for a boson. They are represented by creation and annihilation operators $a_{g_+}$ and $a_{g_+}^+$, and $a_{g_-}$ and $a_{g_-}^+$ with regard to a boson, respectively.

$H_{total}$ includes an interaction of each JPO and the coupler 21.

$g_+$ and $g_-$ are strength of the interaction between each JPO and the two degrees of freedom of the coupler 21. These can be expressed in terms of circuit parameters.

$s_i$ is given as follows:

$$s1 = s2 = 1, s3 = s4 = -1 \tag{2.3}$$

Since each JPO interacts with the coupler 21, it is conceived that the JPOs also indirectly interacts with each other through interaction with the coupler 21. By variable transforming into a form that incorporates influence of the coupler 21 on each JPO, the interaction between each JPO and the coupler 21 is transformed into the four-body interaction among the JPOs.

That is, the Hamiltonian can be transformed into a Hamiltonian in a form in which the JPOs directly interact. This variable transformation is expressed as a unitary transformation using a unitary matrix U in Equation (2.4).

$$U = \tag{2.4}$$

$$\exp\left\{-\frac{g_+}{\omega - \omega_+}\left[\sum_{i=1}^{4}(a_i^+ a_{g_+} - a_i a_{g_+}^+)\right] - \frac{g_-}{\omega - \omega_-}\left[\sum_{i=1}^{4}(a_i^+ a_{g_-} - a_i a_{g_-}^+)\right]\right\}$$

where $\omega$, $\omega_+$, and $\omega_-$ are resonance angular frequencies of the coupler 21 corresponding to $ai$, $a_{g_+}$, and $a_{g_-}$. Difference in angular frequencies between different JPOs is not taken into consideration.

$$\frac{g_+}{\omega - \omega_+} \tag{2.5}$$

and

-continued
$$\frac{g_-}{\omega - \omega_-} \tag{2.6}$$

are assumed to be less than 1. In particular, an absolute value of Expression (2.6) is the same as g' described below.

After performing the unitary transformation, the boson of each JPO is represented in a rotation coordinate system. A frequency of rotation of the coordinate system is different for each JPO. JPOi (i=1, . . . , 4) are represented by coordinate systems that rotate at half a frequency of the pump signals applied to the magnetic field generators 207A to 207D that generate magnetic fluxes to be applied to the SQUID loops of JPOi. Frequencies of the pump signals are different to each other for JPOi (i=1, . . . , 4).

With transition to the rotational coordinate system, a temporally oscillating terms appear in the Hamiltonian. These oscillating terms are averaged at a time scale of interest and can be neglected because their positive and negative values are cancelled out (rotating wave approximation). Due to a difference in pump signal frequencies, many of terms representing interactions among JPOs and between JPOs and the coupler 21 oscillate, and these terms are neglected.

However, there are some interaction terms that do not oscillate, and they remain. The transition to a rotational coordinate system and the rotating wave approximation are a standard method used to focus on a behavior in a time scale characteristic to JPO.

By focusing on the various transformations and the characteristic time scale described above, it is possible to estimate the strength of an interaction between/among JPOs that occurs through the coupler.

Hamiltonian $H'_{total}$ obtained through the above process is given as follows (2.7).

$$H_{total} \rightarrow H'_{total} = \tag{2.7}$$

$$\sum_{i=1}^{4} H'_{JPO,i} - g^{(4)}\left(a_1^+ a_2^+ a_3 a_4 + a_1 a_2 a_3^+ a_4^+ + \sum_{i<j} a_i^+ a_i a_j^+ a_j\right) + H'_{coupler}$$

In Equation (2.7), $H'_{JPO,i}$ and $H'_{coupler}$ are results of transformations of $H_{JPO,i}$ and $H_{coupler}$, respectively.

In Equation (2.7), $g^{(4)}$ is a strength of the four-body interaction (coupling constant), which is given by the following Equation (2.8), using parameters of the circuit.

$$g^{(4)} = \frac{1}{2^8}\frac{(\omega\omega_-)^2}{(\omega - \omega_-)^4}\frac{C^4}{C_J^2(C_g + C)^3}e^2 \tag{2.8}$$

In Equation (2.8),
$\omega$ and $\omega_-$ are resonance angular frequencies of the JPOs and the coupler 21, respectively.

$C_J$, $C_g$, and C are capacitance values of capacitors (206A to 206D) of each JPO, the capacitor (15) of the coupler 21, and coupling capacitors (31A to 31D) between each of JPOs and the coupler 21, respectively, as described above.

e is the electric elementary charge (approximately $1.6 \times 10^{(-19)}$ coulombs).

According to the present example embodiment, for example, it is possible to enlarge the coupling constant $g^{(4)}$ of the four-body interaction from the strength of the four-body interaction (coupling constant) expressed in Equation (2.8) by the following approaches.

<Condition 1> Bringing the resonance angular frequency $\omega$ of each JPO and the resonance angular frequency $\omega_-$ of the coupler 21 closer together.

However, $g^{(4)}$ in Equation (2.8) is derived on assumption that as for interaction between each JPO and the coupler 21, a parameter g' given by the following Equation (2.9) is sufficiently smaller than 1 (g' is a dimensionless quantity quantity).

$$g' = \frac{1}{4} \frac{\sqrt{\omega\omega_-}}{|\omega - \omega_-|} \frac{C}{\sqrt{C_J(C_g + C)}} \tag{2.9}$$

In the example embodiment, while keeping a value of g' small, the coupling constant $g^{(4)}$ for the four-body interaction is enlarged.

<Condition 2> Not bringing the resonance angular frequency $\omega$ of each JPO and the resonance angular frequency $\omega_-$ of the coupler 21 too close.

More specifically, letting $$\omega_-/\omega = 1 \pm \delta \tag{2.10}$$

$\delta$ is set to satisfy the following condition.

$$\delta > \frac{C}{4\sqrt{C_J(C_g + C)}} \tag{2.11}$$

In this case, the following holds.

$$g' < 1 \tag{2.12}$$

<Condition 3> Make the capacitance $C_g$ of the coupler 21 smaller than the capacitance $C_J$ of each JPO. The coupling constant $g^{(4)}$ is given as following Equation (2.13).

$$g^{(4)} = g'^4 \frac{e^2}{C_g + C} \tag{2.13}$$

To enlarge the coupling constant $g^{(4)}$ while keeping g' small, the capacitance $C_g$ of the capacitor 15 of the coupler 21 and capacitance C of each of the coupling capacitors 31A to 31D must be made small.

Since one of circuit parameters that characterizes each JPO is the capacitor $C_J$ of each JPO, the capacitance $C_g$ of the capacitor 15 of the coupler 21 is set to be smaller than the capacitor $C_J$ of each JPO. Note that $C_g$ is also included in g' of Equation (2.9).

To increase the coupling constant $g^{(4)}$ for the four-body interaction, the capacitance C of each of the coupling capacitors 31A to 31D must also be reduced. Since this overlaps with Condition 4 below, only the capacitance $C_g$ of the capacitor 15 of the coupler 21 is considered in the following.

In order to realize a four-body interaction network which the quantum annealing of the LHZ scheme assumes, it is necessary to weaken two-body interaction in which only two of the four JPOs interact with each other.

A strength of each two-body interaction between JPO1 and JPO2, and between the JPO3 and JPO4 in FIG. 3 and FIG. 4 is given by the following Equation (2.14).

$$\frac{1}{16} \frac{C}{C_J + C} \left[ \frac{1}{C_J} + \frac{C}{C_J C + C C_g + C_g C_J} \right]$$

(2.14)

A strength of each two-body interaction between JPO1 and JPO3, between JPO1 and JPO4, between JPO2 and JPO3, and between JPO2 and JPO4 is given by the following Equation (2.15).

$$\frac{C C_g}{4 C_J (C_J C + C C_g + C_g C_J)} \tag{2.15}$$

In the example embodiment, the following condition is met to weaken these two-body interactions.

<Condition 4> Make the capacitance C of each of the coupling capacitors 31A to 31D between each JPO and the coupler 21 smaller than the capacitance $C_J$ of each JPO.

Qualitatively, the four-body interaction is able to be strengthened with the conditions 1-4 met.

Following settings meet the four conditions 1-4 above.

Frequency of JPO $\omega/(2\pi)$: 10 GHz (gigahertz)

Frequency of the coupler 21 $\omega_-/(2\pi)$: 9.98 GHZ

Capacitance of each JPO $C_J$: 1000 fF (femtofarad)

Capacitance of the coupler $C_g$: 200 fF

Coupling capacitance between each JPO and the coupler 21 C: 1 fF

The Josephson junction is adjusted so that the above frequencies are realized.

With this setting, a strength of the four-body interaction: $g^{(4)}/(2\pi)$ is given as follows.

$$\hbar \times 1.16 \text{ MHz (megahertz)}$$

(Dirac's constant $$\hbar = \frac{h}{2\pi} = 1 \times 10^{-34} \text{m}^2\text{kg/s}$$

where, h is a Planck constant.

The parameter g' in Equation (2.9) (which is assumed to be sufficiently smaller than 1) is about 0.28.

The strength of the four-body interaction: $g^{(4)}/(2\pi)$ $\hbar \times 1.16$ MHz is greater than a strength of the four-body interaction which is calculated on a setting of NPL1:

$$\hbar \times 63 \text{ kHz (kilohertz)}$$

That is, in the above Equation (1.3), when $E_J/(2\pi)=600$ GHz, $\phi_c=0.12 \phi_0$, and $g_k/\Delta_k\sim0.12$, C/(2π)=63 kHz. (reference may be made to description of Equation (23) in Supplementary Note 6 of NPL 1.)

Figure 5:
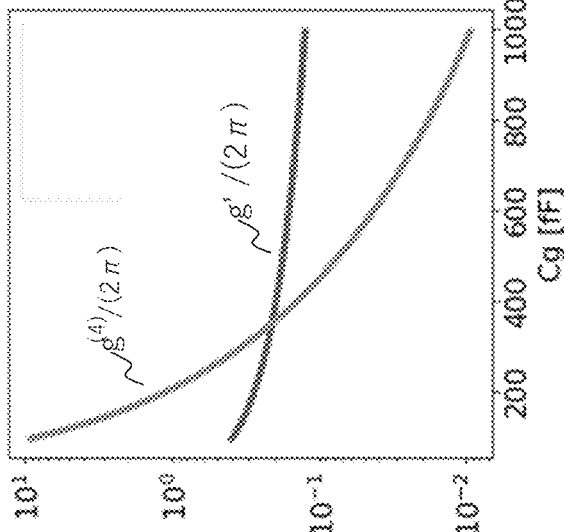
FIG. 5 is a diagram schematically illustrating the example embodiment.

FIG. 5 illustrates changes in coupling constants $g^{(4)}$ and g' when only capacitance $C_g$ of the coupler 21 is changed. In FIG. 5, $g^{(4)}/(2\pi)$ and $g'/(2\pi)$ are illustrated. In FIG. 5, frequency $\omega\_/(2\pi)$ of the coupler 21 is fixed at the above setting (9.98 GHz).

It can be seen that the strength of the four-body interaction (coupling constant) $g^{(4)}$ increases as the capacitance $C_g$ of the coupler 21 is made smaller. The reason why the four-body interaction is strengthened can be interpreted as follows.

In the superconducting quantum circuit of the above example embodiment, the four-body interaction among JPOs is realized by the following two elements.

interaction between JPOs and the coupler 21, and nonlinearity when the coupler 21 is quantized.

As capacitor $C_g$ of the coupler 21 is reduced, the nonlinearity of the coupler 21 is increased, as a result of which the four-body interaction is strengthened.

Since g' in Equation (2.9) is kept small, the interaction between JPOs and the coupler 21 is not strengthened, but instead, the four-body interaction is strengthened by making the capacitance $C_g$ of the coupler 21 smaller.

As described above, in the example embodiment, by adjusting circuit parameters in consideration of the above conditions and substituting the circuit parameters into Equation (2.8) which expresses the coupling constant $g_{(4)}$, it is possible to realize a circuit in which the four-body interaction is strong and other interactions, i.e., the two-body interaction between two of the four JPOs are weakened.

Configuration Example 1

Figure 6:
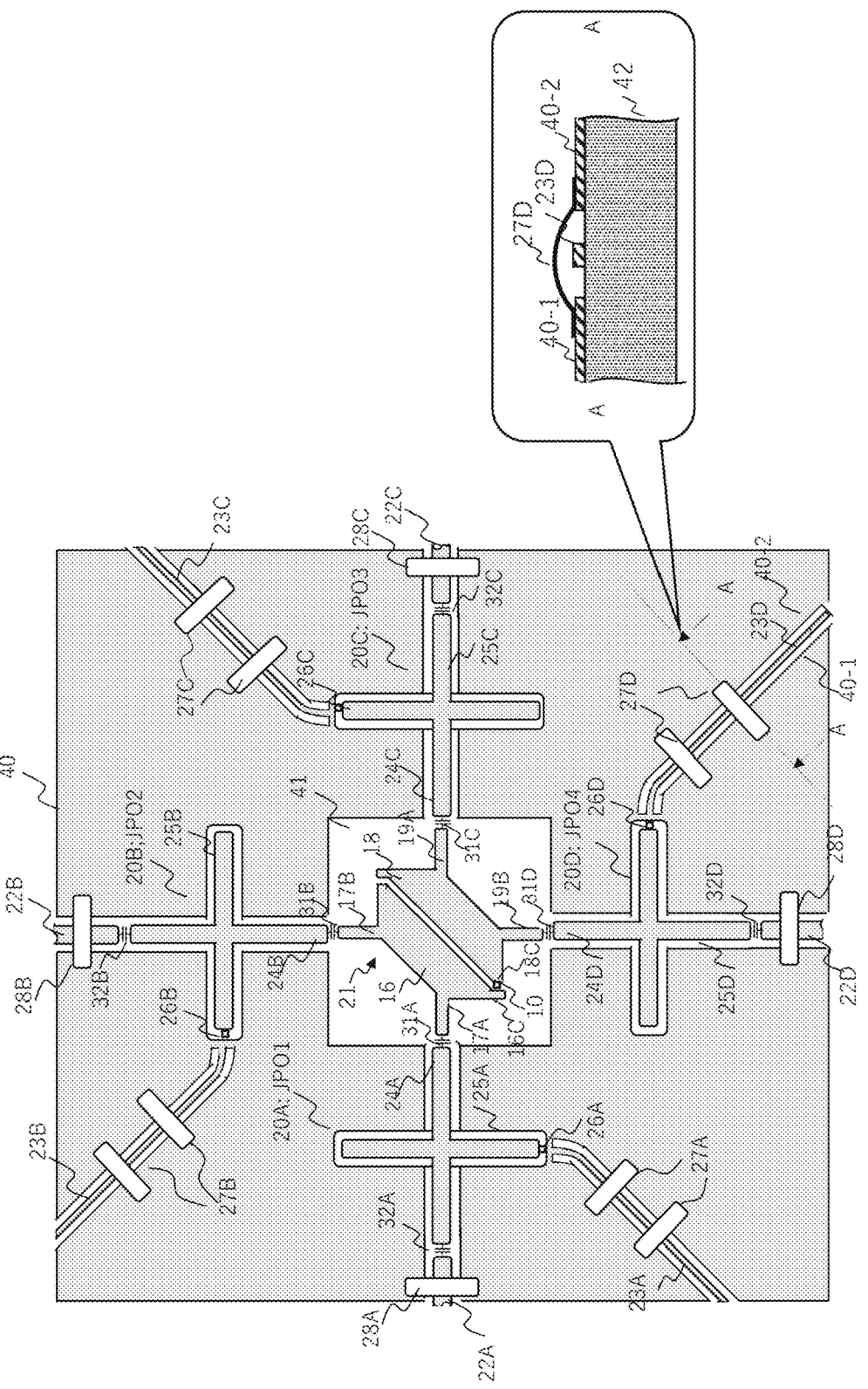
FIG. 6 is a diagram illustrating the example embodiment.

FIG. 6 illustrates a non-limiting example of the above example embodiment. FIG. 6 is a schematic diagram of a wiring pattern (planar circuit) of a superconducting quantum circuit fabricated on a substrate such as silicon.

FIG. 6 illustrates a planar configuration of a coupler 21, in which four qubits (quantum bits) are configured with four JPO1 (20A) to JPO4 (20D) of a lumped element type, and these four qubits (quantum bits) are coupled with the four-body interaction.

JPO1 (20A) to JPO4 (20D) of the lumped element type are configured with a linear (not nonlinear) inductance, a capacitance component, and a resonator with a nonlinear element including a Josephson junction.

In the example embodiment, the coupler 21 and JPO1 to JPO4 are realized by lines (wirings) formed by superconductors on a substrate, for example. Silicon (Si) is used as the substrate, but an electronic material such as sapphire or a compound semiconductor material (group IV, group III-V and group II-VI) may be used. The substrate is preferably a single crystal but may be a polycrystalline or amorphous. As a material of the line (wiring material), Nb (niobium) or Al (aluminum) may be used, for example, though not limited thereto. Any metal that becomes superconductive at a cryogenic temperature may be used, such as niobium nitride, indium (In), lead (Pb), tin (Sn), rhenium (Re), palladium (Pd), titanium (Ti), molybdenum (Mo), tantalum (Ta), tantalum nitride, and an alloy containing at least one of the above metals. In order to achieve superconductivity, a coupler circuit is used in a temperature environment of about 10 mK (millikelvin) achieved by a refrigerator.

Referring to FIG. 6, a planar shape of a first electrode 16 is an approximately trapezoidal and is of a shape with rotated about 45 degrees counterclockwise. First and second opposing portions 17A and 17B of the first electrode 16 are extended, respectively, from vicinities of intersections between an upper side and oblique sides (legs) of the trapezoid toward a top and left sides in the drawing, i.e., toward locations where the JPO 20A and 20B are disposed. A planar shape of a second electrode 18 is of a shape of an inverted trapezoid where a trapezoid is rotated clockwise by approximately 135 degrees. Third and fourth opposing portions 19A and 19B of the second electrode 18 are extended, respectively, from vicinities of intersections of an upper side and oblique sides (legs) of the trapezoid toward a bottom side and a right side in the drawing, i.e., toward locations where the JPO 20C and 20D are disposed. The first electrode 16 and the second electrode 18 are arranged with respective bottom sides of the trapezoids facing each other, and a planar shape thereof, when aligned with the opposing portions 17A, 17B, 19A and 19B excluded, is almost hexagonal.

The first electrode 16 has a protrusion 16C which protrudes downward in the drawing in a vicinity of an intersection of one end of a lower base and one of the oblique sides of the first electrode 16. The second electrode 18 has a cut portion 18C obtained by cutting off the second electrode 18 so as to be in parallel to the protrusion 16C of the first electrode 16 in a vicinity of an intersection of one end of the lower base and one of the oblique sides of the second electrode 18. A nonlinear element 10, such as a SQUID, is arranged in a gap between the protrusion 16C, which is located in a vicinity of an intersection of one end of the lower base and one of the oblique sides of the first electrode 16, and the cut portion 18C, which is located in a vicinity of an intersection of one end of the lower base and one of the oblique sides of the second electrode 18. A configuration illustrated in FIG. 6 makes a placement area of the coupler 21 compact with a diagonally arranged configuration of the first electrode 16 and the second electrode 18 in the coupler 21.

JPO1 (20A) to JPO4 (20D) include coplanar waveguides (Coplanar Waveguides) 25A, 25B, 25C and 25D and SQUIDs 26A, 26B, 26C, and 26D, respectively. JPO1 (20A) to JPO4 (20D) are LC resonant circuits in a microwave region which are provided with linear inductance components and capacitance components of the coplanar waveguides 25A, 25B, 25C and 25D and nonlinear inductance components of SQUIDs 26A, 26B, 26C, and 26D, respectively. By applying DC current to each of control lines 23A, 23B, 23C, and 23D which are inductively coupled with the SQUIDs 26A, 26B, 26C, and 26D, respectively, a resonance frequency thereof can be adjusted. By applying AC current to each of control lines 23A, 23B, 23C, and 23D of JPO1 (20A) to JPO4 (20D), parametric oscillation can be induced.

Connection portions (waveguides for I/O) 22A to 22D for connecting to readout circuits are capacitively coupled via capacitors 32A to 32D with JPO1 (20A) to JPO4 (20D), respectively. In FIG. 6, the connection portions (coplanar waveguides for I/O) 22A, 22B, 22C, and 22D for connecting to the readout circuits, respectively, are shown in part. Each wiring pattern of the connection portions (coplanar waveguides for I/O) 22A to 22D may have a configuration extended to a chip periphery and, for example, connected to a wiring substrate or the like (not shown) via a bump electrode or the like. Each wiring pattern of the connection portions may be connected to a measurement device or the like outside a refrigerator via a readout line (cable) or the like. In FIG. 6, the capacitor 15 illustrated in FIG. 4 is omitted.

In an example illustrated in FIG. 6, the superconducting quantum circuit apparatus includes air bridge wirings 27A, 27B, 27C, and 27D provided for the control lines 23A, 23B, 23C, and 23D of the coplanar waveguide configuration, where the air bridge wirings 27A, 27B, 27C, and 27D are overhead wired on a wiring layer to stabilize ground plane (ground pattern) 40 surrounding JPO 20A, 20B, 20C, and 20D. The control lines 23A, 23B, 23C, and 23D have configurations that are connected to a wiring substrate or the like (not shown) via bump electrodes or the like (not shown) at a periphery of a chip or the like, for example, and are connected to a signal generation apparatus (current control unit) or the like outside the refrigerator.

In FIG. 6, a cross section along an A-A line orthogonal to the control line 23D is schematically illustrated in a balloon. A cross section for the control lines 23A to 23C is also configured in an identical manner. For example, a wiring layer is formed on a surface of a substrate 42 of silicon, on which JPOs 20 (20A to 20D), and the coupler (21) in the center are formed. The control line 23D is configured as a coplanar waveguide in the same wiring layer. Ground patterns 40-1 and 40-2 are provided on both sides of the control line 23D (wiring) in a longitudinal direction, via gaps, respectively. The air bridge wiring 27D, which is made of a superconducting material (e.g., Al or the like), is formed in such a manner that strides over the control line 23D in an arch shape and connects the ground patterns 40 on both sides of the control line 23D. An air bridge wiring structure with respect to the ground pattern 40 eliminates division of the ground pattern 40 into both sides 40-1 and 40-2 by the control line 23 (23A through 23D) which is configured as the coplanar waveguide, resulting in a stabilization of a ground potential of the ground plane 40 that surrounds JPO1 (20A) to JPO4 (20D). As a non-limiting example, in FIG. 8, the connection portions (coplanar waveguides for I/O) 22A to 22D for connecting to readout circuits are provided with air bridge wirings 28A, 28B, 28C, and 28D, which are overhead wired on the wiring layer, respectively, as well as the control lines 23A through 23D. The air bridge wirings 28A to 28D of the connection portions (coplanar waveguides for I/O) 22A to 22D also have the same cross-section configuration.

Letting $C_J$ be a capacitance value of a capacitor between each of the coplanar waveguides 25A to 25D of JPO1 (20A) to JPO4 (20D) and ground (206A to 206D in FIG. 3), $C_g$ a capacitance value of the capacitor 15 between the first and second electrodes 16 and 18 of the coupler 21, and C each of a capacitance value of a coupling capacitor (31A in FIG. 2) between the first opposing portion 17A of the coupler 21 and the coupler connection portion 24A of the coplanar waveguide 25A of JPO1 (20A), a capacitance value of a coupling capacitor (31B in FIG. 2) between the second opposing portion 17B of the coupler 21 and the coupler connection portion 24B of the coplanar waveguide 25B of JPO2 (20B), a capacitance value of a coupling capacitor (31C in FIG. 2) between the third opposing portion 19A of the coupler 21 and the coupler connection portion 24C of the coplanar waveguide 25C of JPO3 (20C), and a capacitance value of a coupling capacitor (31D in FIG. 2) between the fourth opposing portion 19B of the coupler 21 and the coupler connection portion 24D of the coplanar waveguide 25D of JPO4 (20D), the following magnitude relation is set. $C_J > C_g > C$ By setting a resonance angular frequency of each of JPO1 (20A) to JPO4 (20D) closer to a resonance angular frequency of the coupler 21, the coupling strength of the four-body interaction can be set to be larger.

A length (width) of opposing sides of the first and second electrodes 16 and 18 of the coupler 21 is longer than width of coupler connection part 24A to 24D of the waveguides 25A to 25D of JPO1 (20A) to JPO4 (20D) which face ends of the first and second opposing portions 17A and 17B and the third and fourth opposing portions 19A and 19B of the coupler 21. A gap (cap) between the opposing sides of the first and second electrodes 16 and 18 of the coupler 21 is smaller than a gap between the ends of the coupler connection parts 24A and 24B, and the coupler connection parts 24C and 24D, and the first and second opposing parts 17A and 17B, and the third and fourth opposing parts 19A and 19B, respectively opposed thereto. Therefore, from FIG. 6, which schematically illustrates the wiring pattern, a capacitance C of the coupling capacitors 31A to 31D between the waveguides 25A and 25B of JPO1 (20A) and JPO2 (20B), the waveguides 25C and 25D of JPO3 (20C) and JPO4 (20D), and the first and second opposing portions 17A, 17B, and the third and fourth opposing portions 19A, 19B is found to be smaller than the capacitance $C_g$ between the electrodes 16 and 18 of the coupler 21 (capacitance of the capacitor 15 connected in parallel to the nonlinear element 10). In each of cross-shaped waveguides 25A to 25D (planar waveguides) of JPO1 (20A) to JPO4 (20D), a length of a side opposed to the ground plane (ground pattern) 40 via a gap, is several times longer than that of an opposing side of the first and second electrodes 16 and 18 as much as it looks like. Thus, in FIG. 6, each capacitance $C_J$ (206A to 206D in FIG. 3) of JPO1 (20A) to JPO4 (20D) is found to be larger than the capacitance $C_g$ (15 in FIG. 3) between the first and second electrodes 16 and 18 of the coupler 21.

The strength $g^{(4)}$ of the four-body interaction depends on a detuning of resonant frequencies of the coupler (four-body interaction coupler) 21 and of JPOs (20A to 20D). Therefore, it is possible to control a coupling strength of the four-body interaction by adjusting the resonant frequencies of JPOs (20A to 20D) and the coupler 21.

The first and second electrodes 16 and 18 of the coupler 21 are coupled each other via capacitor 15 and further coupled to JPOs 20A, 20B, 20C, and 20D via the coupling capacitors 31A, 31B, 31C, and 31D, respectively, and are entirely enclosed by the ground pattern (ground plane) 40. The first and second opposing portions 17A and 17B, and the third and fourth opposing portions 19A and 19B that are capacitively coupled with JPO 20A and JPO 20B, and JPO 20C and JPO 20D, respectively, are protruded from the first electrode 16 and the second electrode 18 toward the ground plane 40, respectively, and able to be coupled with JPO 20A and JPO 20B, and JPO3 20C and JPO 20D at points spaced away from the first electrode 16 and from the second electrode 18.

By ensuring spacing between portions of the first electrode 16 and second electrode 18 other than the coupling capacitors 31A-31D and the ground pattern 40 with a large gap (almost equivalent in size as the coupler 21) where no superconductor is deposited, for example, on the order of about 100 μm (micrometers) in length, a stray capacitance between each of the first 16 and the second electrode 18 and the ground pattern 40 is reduced.

The capacitor 15 between the first and second electrodes 16 and 18 makes the coupler 21 robust against a disturbance(s) caused by a magnetic field noise, etc. The reduction of the stray capacitance of the first and second electrodes 16 and 18 has an effect of strengthening the four-body interaction. The coupling strength of the four-body interaction by the coupler 21 capacitively coupled to each JPO is generally weakened due to the stray capacitance of the coupler 21, since a contribution ratio of the capacitance that contributes to coupling out of a total capacitance, which is a summation of a self-capacitance ($C_g$) of the coupler 21 plus the capacitance C of the coupling capacitor and the stray capacitance of the coupler 21, is reduced. In the example illustrated in FIG. 6, the coupler 21 is placed separated from an edge of the ground plane (ground pattern)

40 surrounding the coupler 21 via a gap of the same extent as a size of the coupler 21, for example, thus reducing the stray capacitance of the coupler 21.

Configuration Example 2

Figure 7:
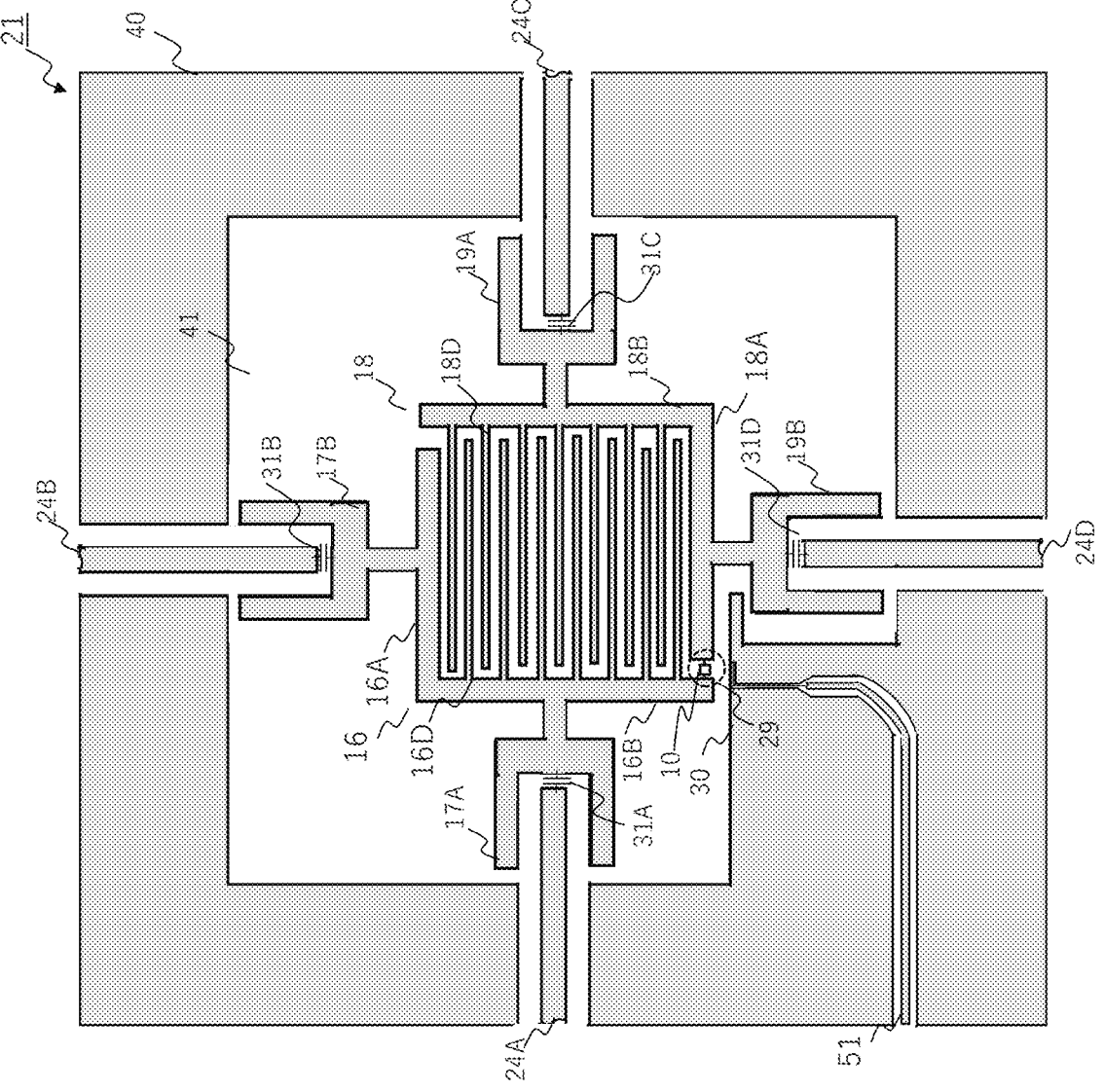
FIG. 7 is a diagram schematically illustrating an example.

FIG. 7 illustrates a coupler (four-body interaction coupler) 21 of another non-limiting example. In FIG. 7, a planer circuit corresponding to the coupler 21 illustrated in FIG. 4 is illustrated while qubits (quantum bits) (JPO) 20A to 20B are not shown. Referring to FIG. 7, the coupler 21 of the present variation example, includes a first electrode 16 configured with right-angle bent sides (lateral (horizontal) side 16A and longitudinal (vertical) side 16B), and a second electrode 18 configured with right-angle bent sides (lateral (horizontal) side 18A and longitudinal (vertical) side 18B). The longitudinal sides 16B and 18B of the first and second electrodes 16 and 18 are disposed opposed to each other, and the lateral sides 16A and 18A thereof are also disposed opposed to each other. The first electrode 16 includes n (seven in FIG. 7) extension portions 16D extending at a predetermined interval parallel to the lateral side 16A from the longitudinal side 16B to the longitudinal side 18B of the second electrode 18 to have a comb-teeth pattern shape. The second electrode 18 also includes n extension portions 18D extending at a predetermined interval parallel to the lateral side 18A from the longitudinal side 18B to the longitudinal side 16B of the first electrode 16 to have a comb-tooth pattern shape. The extension portions 16D and 18D each corresponding to a comb-teeth are arranged facing to each other in a nested structure. Assuming that a capacitance between neighboring extension portions 16D and 18D, a capacitance between the lateral side 16A and the extension portion 18D opposed thereto, and a capacitance between the lateral side 18A and the extension portion 16D opposed thereto are the same value $C_a$, and a capacitance $C_1$ between the lateral sides 16A and 18A is approximated by a configuration with parallelly connected 2n+1 capacitors of a capacitance value: $C_a$, the capacitance C1 is given as follows.

$$C_1 = (2n + 1) \times C_a \qquad (2.16)$$

Assuming that the extension portions 16D and 18D, which are arranged opposed to each other in a nested manner and each have comb-teeth shape, are not provided, a space between the lateral sides 16A and 18A is (2n+1) times larger than the space between opposing extension portions 16D and 18D in FIG. 7. In this case, regarding a capacitance $C_2$ between the lateral sides 16A and 18A, the following holds.

$$C_2 < C_a/(2n + 1) \qquad (2.17)$$

The capacitance $C_1$ between the first and second electrodes 16 and 18, each of which has a structure that are arranged comb-teeth opposed to each other in a nested manner, is, as a coarse estimate, greater than $(2n+1)^2$ times the capacitance $C_2$ without a nested comb-teeth structure.

With the comb-shaped capacitor (inter-digital capacitor) between the first and second electrodes 16 and 18, a capacitance between the electrodes 16 and 18 is increased, thus further effectively reducing an impact exerted by a voltage fluctuation due to such as an electric field noise to implement a stable four-body interaction coupling.

The longitudinal side 16B of the first electrode 16 includes a first opposing portion 17A corresponding to a coupler connection part 24A of JPO 20A. and the lateral side 16A of the first electrode 16 includes a second opposing portion 17B corresponding to a coupler connection part 24B of JPO 20B. Each of the first and second opposing portions 17A and 17B has a U-shaped expanded portion and a base portion connected to the first electrode 16. In spaces of the U-shaped expanded portions of the first and second opposing portions 17A and 17B, coupler connection parts 24A and 24B, each of which is configured as a coplanar waveguide, are arranged, respectively.

The longitudinal side 18B of the second electrode 18 includes a third opposing portion 19A corresponding to a coupler connection part 24C of JPO 20C, and the lateral side 18A of the second electrode 18 includes a fourth opposing portion 19B corresponding to a coupler connection part 24D of JPO 20D. Each of the third and fourth opposing portions 19A and 19B has a U-shaped expanded portion and a base portion connecting to the electrode 18. In the U-shaped expanded portions of the third and fourth opposing portions 19A and 19B, coupler connection parts 24C and 24D of coplanar waveguide type are arranged, respectively.

A nonlinear element 10 is configured by a SQUID disposed between an end of the longitudinal side 16B of the first electrode 16 and an end of the lateral side 18A of the second electrode 18. The SQUID included in the nonlinear element 10 which bridges the first electrode 16 (an end of the longitudinal side 16B) and the second electrode 18 (an end of the lateral side 18A). In FIG. 7, the first electrode 16 (an end of the longitudinal side 16B) and the second electrode 18 (an end of the lateral side 18A), each of which are bridged by the SQUID designated by reference numeral 10, are illustrated with reference numeral 29, enclosed with a dashed circle as the SQUID bridging portion. The coupler 21 further includes a control line 51 which applies a magnetic flux to the SQUID from within the same plane. By varying a current (i.e., direct current) supplied to the control line 51, a frequency variable coupler is provided. The external magnetic flux given through the control line 51 from the current control part penetrates through the SQUID loop of the four-body interaction coupler 21, thereby varying an effective self-inductance of the SQUID loop. As a result, the resonance frequency is varied.

In the variation example illustrated in FIG. 7, a distance between the electrode and the ground (ground pattern 40) is reduced only partially in a vicinity of the SQUID bridging portion 29 of the first electrode 16 and the second electrode 18. In the vicinity of the SQUID bridging portion 29, the control line 51 is provided to allow an external magnetic flux to be applied from the immediate vicinity of the SQUID bridging portion 29, as a result of which the magnetic flux through inductive coupling from the control line 51 can be efficiently applied. As described, it is preferable that the ground pattern 40 is basically spaced apart from the first and second electrodes 16 and 18. The ground pattern 40 has a portion 30 (ground pattern protruding portion) in the vicinity of the SQUID bridging portion 29 that protrudes itself inwardly to be closer to the SQUID bridging portion 29. Thus, the length of the portion 30 is preferably ¼ or less of a circumference of an inner circumference of the ground plane 40 surrounding the electrodes 16 and 18. It may further preferably be ⅙ or less, and even preferably ⅛ or less.

In the coupler 21 of this configuration, letting $C_J$ be a capacitance value of a capacitor (206A to 206D in FIG. 3) of the of JPO1 (20A) to JPO4 (20D), $C_g$ be a capacitance value of coupling capacitors (31A to 31D in FIG. 3) between the coupler connection parts 24A to 24D of JP01 (20A) to JPO4 (20D) and the opposing portions 17A, 17B, 19A and 19B of the coupler 21m, the following magnitude relation holds.

$C_J > C_g > C$

Configuration Example 3

Figure 8:
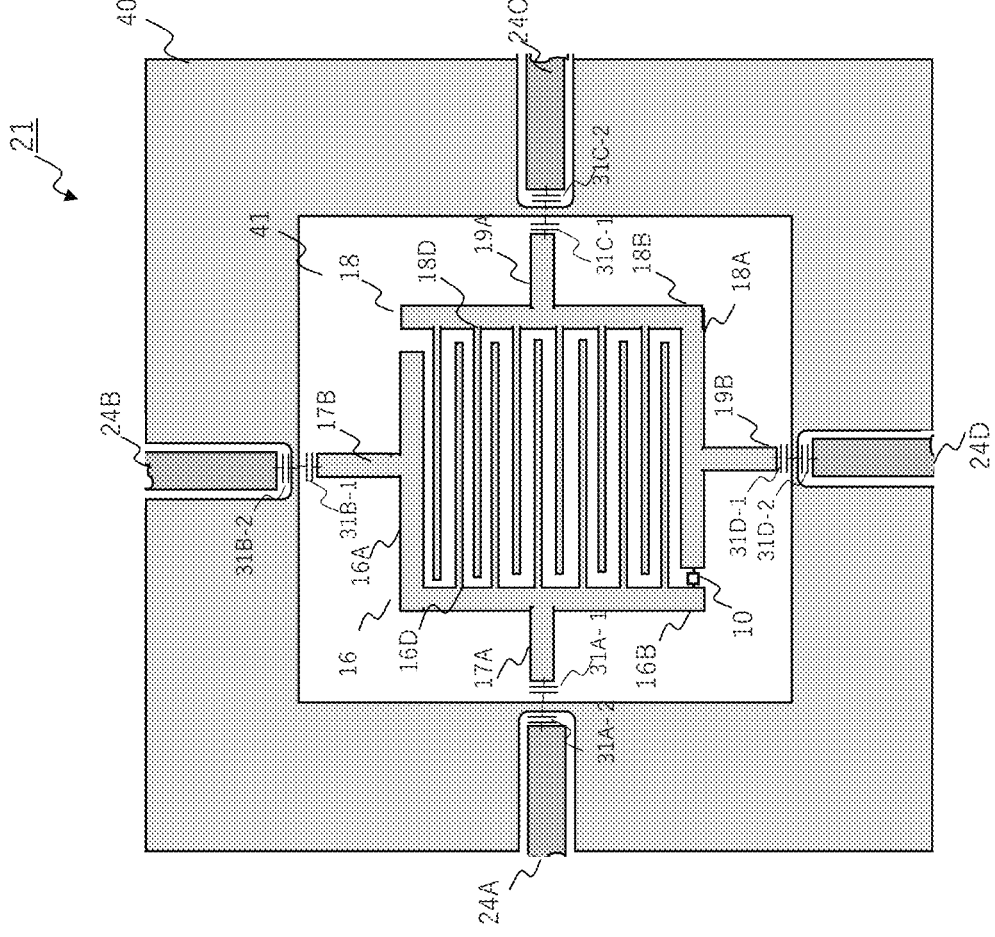
FIG. 8 is a diagram schematically illustrating a variation example.

FIG. 8 illustrates a coupler (four-body interaction coupler) 21 of yet another non-limiting example. In FIG. 8, a planer circuit corresponding to the coupler 21 illustrated in FIG. 4 is illustrated while qubits (quantum bits) (JPO) 20A to 20B are not shown. Referring to FIG. 8, the coupler 21 has a structure such that the grand pattern 40, which penetrates between first second opposing portions 17A and 17B, and the third and fourth opposing portions 19A and 19B, and coupler connection parts 24A, 24B, 24C, and 24D. For example, the coupler connection parts 24A, 24B, 24C, and 24D of JPO 20A, 20B, 20C, and 20D connect to ground via capacitors 31A-2, 31B-2, 31C-2, and 31D-2, respectively, and the first and second opposing portions 17A and 17B and the third and fourth opposing portions 19A and 19B corresponding to the coupler connection parts 24A, 24B, 24C, and 24D, is connected to the ground via the capacitor 31A-1, 31B-1, 31C-1, and 31D-1, respectively. The space between the coupler connection parts 24A and 24B of JPO 20A and 20B and the first and second opposing portions 17A and 17B are shielded (theory of electrostatic shielding), and the space between the coupler connection parts 24C and 24D of JPO 20C and 20D and the third and fourth opposing portions 19A and 19B are shielded. Therefore, the capacitance between coupler connection parts 24A and 24B of JPOs 20A and 20B and the first and second opposing portions 17A and 17B, and capacitance between the coupler connection parts 24C and 24D of JPOs 20C and 20D and third and fourth opposing portions 19A and 19B operate as coupling capacitors 31A to 31D with smaller capacitance value than a configuration without ground pattern between coupler connection parts of JPOs and opposing portions (FIG. 7).

In the coupler 21 of this configuration, regarding $C_J$ which is a capacitance value of the capacitor (206A to 206D in FIG. 3) of the of JPO1 (20A) to JPO4 (20D), $C_g$ which is a capacitance value of the capacitor of the coupler 21, C which is a capacitance value of coupling capacitors (31A to 31D in FIG. 3) between the coupler connection parts 24A to 24D of JPO1 (20A) to JPO4 (20D) and the opposing portions 17A, 17B, 19A and 19B of the coupler 21, the following magnitude relation holds.

$C_J > C_g > C$

Another Example Embodiment

Figure 10:
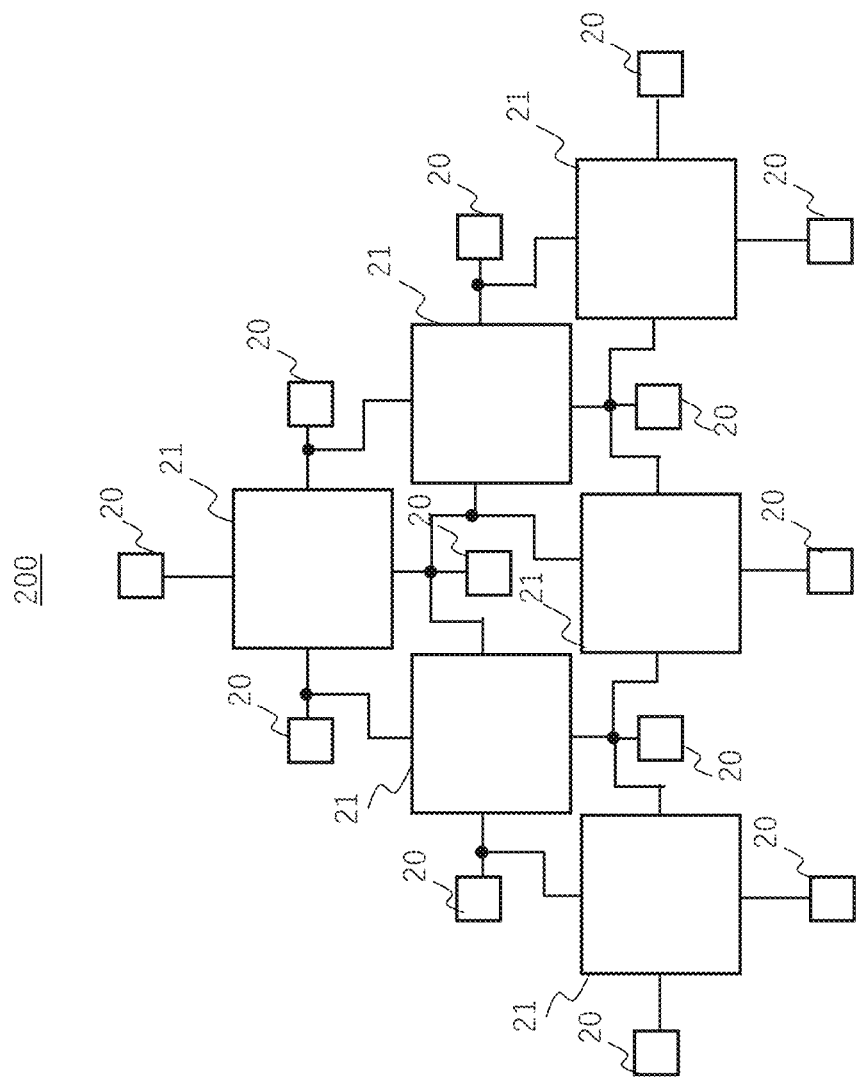
FIG. 10 is a diagram illustrating the example embodiment.

FIG. 10 illustrates a schematic diagram of a quantum computer 200 with JPO 20 integrated as a configuration example of another example embodiment. In the configuration illustrated in FIG. 10, each four-body interaction coupler 21 is connected to the four JPOs 20, respectively, as illustrated in FIG. 4 and/or FIG. 6. Each JPO 20 is connected to one through four four-body interaction couplers 21, and JPO 20 is arranged to be shared by a plurality of unit structures to provide a configuration in which a plurality of unit structures illustrated in FIG. 3, FIG. 4, and FIG. 6, etc., are arranged. In the quantum computer 200, at least one JPO

20 is connected to a plurality of four-body interaction couplers 21. Specially, in the example as illustrated in FIG. 10, at least one JPO 20 is connected to four four-body interaction couplers 21. The quantum computer 200 may also be described as follows. The quantum computer 200 includes a plurality of JPOs 20, each of which is connected to one through four four-body interaction couplers 21. The number of the four-body interaction couplers 21 to which each JPO 20 connects corresponds to how many unit structures share JPOs 20. Thus, in the example illustrated in FIG. 10, the quantum computer 200 includes a plurality of unit structures, and a plurality of unit structures share JPO 20. In the example illustrated in FIG. 10, 13 superconducting nonlinear JPOs 20 are integrated, but any number of JPOs 20 may be integrated in a similar manner. A current control part and a readout part are not illustrated in FIG. 10, for ease of understanding of the drawing, but as explained with reference to FIG. 2, etc., the current control part and the readout part are used to control and read out JPO 20.

\<Derivation of the Above Equation for the Four-Body Interaction\>

Figure 9:
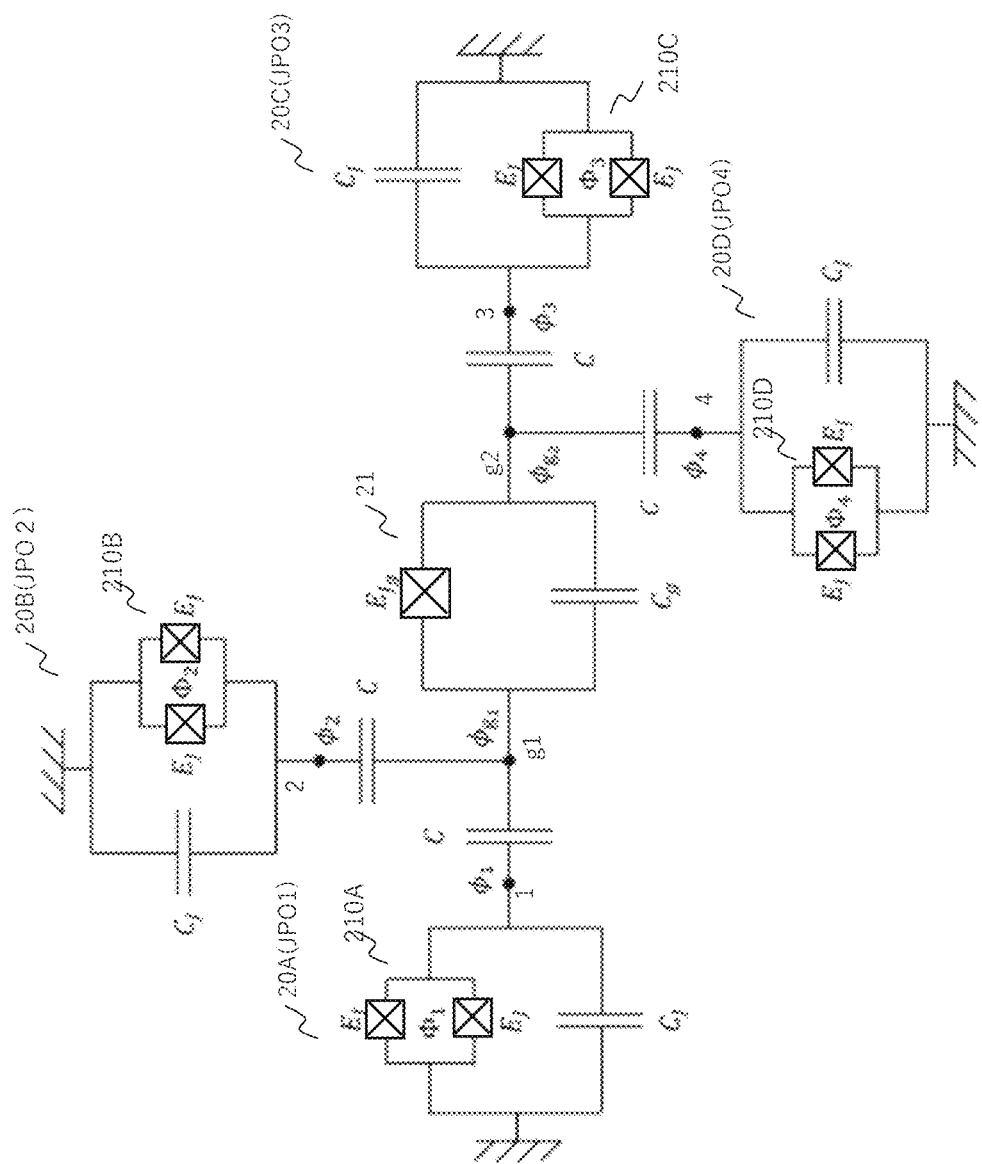
FIG. 9 is a diagram schematically illustrating a variation example.

The following describes the derivation of the above equation. As described in NPL 2, FIG. 9 is a diagram corresponding to FIG. 3. In FIG. 9, Josephson junction is indicated by an x surrounded by a square, and ϕ1 to ϕ4 in SQUID loops 210A to 210D of JPO1 to JPO4 represent a magnetic flux penetrating through each SQUID loop. The EJs attached to the two Josephson junctions in SQUID loops 210A to 210D of JPO1 to JPO4 represent the Josephson energy.

1. CLASSICAL HAMILTONIAN

As illustrated in FIG. 9, magnetic flux ϕ1 to ϕ4, ϕg1 and ϕg2 are arranged on each node 1 to 4, g1 and g2.

In a circuit with an inductor (Josephson junction can be regarded as a nonlinear inductor) and a capacitor (non-dissipative circuit), $V = -d\phi/dt$ with respect to a time derivative of the magnetic flux $\phi$ (Faraday's law). Therefore, an energy $E = (\frac{1}{2}) CV^2$ of a capacitance branch (voltage V at both ends) is expressed as follows.

$$E = \frac{1}{2} C \dot{\phi}^2 \qquad (3.1)$$

That is, a capacitor energy can be treated as kinetic energy. Let $\phi$ be a vector (6-dimensional vector) whose elements are $\phi_1$ to $\phi_4$, $\phi_{g1}$, and $\phi_{g2}$.

$$\phi = \begin{pmatrix} \phi_1 \\ \phi_2 \\ \phi_3 \\ \phi_4 \\ \phi_{g_1} \\ \phi_{g_2} \end{pmatrix} \qquad (3.2)$$

In FIG. 9, the energy (kinetic energy) of a capacitor branch is given by (3.3).

$$\frac{1}{2} \dot{\phi}^t C_{mat} \dot{\phi} \qquad (3.3)$$

Here, Cmat is, as shown in the following Equation (3.4), a circuit matrix (6-rows and 6 columns matrix) of capacitance branches in FIG. 9.

$$C_{mat} = \begin{pmatrix} C_J + C & 0 & 0 & 0 & -C & 0 \\ 0 & C_J + C & 0 & 0 & -C & 0 \\ 0 & 0 & C_J + C & 0 & 0 & -C \\ 0 & 0 & 0 & C_J + C & 0 & -C \\ -C & -C & 0 & 0 & C_g + 2C & -C_g \\ 0 & 0 & -C & -C & -C_g & C_g + 2C \end{pmatrix} \quad (3.4)$$

An element $C_J + C$ of k-th row and k-th column (k=1 to 4) of matrix $C_{mat}$ is a combined capacitance of two capacitors C and $C_J$ that are connected in parallel to a node k (k=1-4). An element $C_J + 2C$ in k-th row and k-th column (k=5, 6) of the matrix $C_{mat}$ is a combined capacitance of three capacitors C, C and $C_J$ connected in parallel to a node k (k=5, 6). An element of i-th row and j-column (i≠j, i,j=1-6) of the matrix $C_{mat}$ is a capacitance between nodes i and j (signs indicate a direction of the capacitor branch).

A Lagrangian for a circuit in FIG. 9 is given by Equation (3.5).

$$L = \frac{1}{2}\dot{\phi}^t C_{mat}\dot{\phi} - V(\phi) \quad (3.5)$$

In Equation (3.5), $V(\phi)$ is potential energy and is given by Equation (3.6).

$$V(\Phi) = -\sum_{i=1}^{4} E_J(\Phi_i)\cos\frac{\Phi_i}{\phi_0} - E_{Jg}\cos\frac{\phi_{g1} - \phi_{g2}}{\phi_0} \quad (3.6)$$

where, $$E_J(\Phi) = E_J\cos\frac{\Phi}{\phi_0} \quad (3.7)$$

$$\phi_0 = \frac{1}{2e}\left(\frac{h}{2\pi}\right) \quad (3.8)$$

$E_J$ is Josephson energy in JPO1-JP04.

$E_{Jg}$ is Josephson energy in a coupler 21.

$\Phi_i$ is a magnetic flux penetrating through the SQUID loop of $JPO_i$ (i=1, . . . , 4).

$\phi_{g1}$-$\phi_{g2}$ is a magnetic flux penetrating through the coupler 21 (a difference between respective magnetic fluxes of nodes g1 and g2).

The kinetic energy of the Lagrangian $$\frac{1}{2}\dot{\phi}^t C_{mat}\dot{\phi} \quad (3.9)$$

is expressed using a vector q.

$$q = (q_1, q_2, q_3, q_4, q_{g1}, q_{g2})^t = \frac{\partial L}{\partial \dot{\phi}} = C_{mat}\dot{\phi} \quad (3.10)$$

$q_1, q_2, q_3, q_4, q_{g1}$, and $q_{g2}$ are a charge of each node. t is a transpose operator.

From Equation (3.10), assuming that the matrix $C_{mat}$ is normal, we obtain the following.

$$\dot{\phi} = C_{mat}^{-1}q \quad (3.11)$$

Therefore, the kinetic energy in Equation (3.9) can be expressed using vector q as follows.

$$\frac{1}{2}\dot{\phi}^t C_{mat}\dot{\phi} = \frac{1}{2}(C_{mat}^{-1}q)^t C_{mat}(C_{mat}^{-1}q) = \frac{1}{2}q^t(C_{mat}^{-1})^t Iq = \frac{1}{2}q^t C_{mat}^{-1}q \quad (3.12)$$

In Equation (3.12), I is a unit matrix of 6×6. The last Expression in Equation (3.12) uses the fact that the matrix $C_{mat}$ is a symmetric matrix (component $c_{ij}$(i,j=1, . . . , 6) is $c_{ij}$=$c_{ji}$ with respect to subscripts i and j), which is symmetric with respect to a main diagonal, and an inverse matrix $C_{mat}^{-1}$ of $C_{mat}$ is also a symmetric matrix. That is, $C_{mat}$ $C_{mat}^{-1}$=I. By taking the transpose of both sides of this Equation, we have $(C_{mat}^{-1})^t C_{mat}^t$=I. Since $C_{mat}$ is a symmetric matrix, by multiplying both sides by the inverse matrix $C_{mat}^{-1}$ from a right side, $(C_{mat}^{-1})^t$=$C_{mat}^{-1}$, and thus Equation (3.12) holds.

Expressing potential energy as a function of vector $\phi$ (nonlinear function), the Hamiltonian is given as follows.

$$H = \frac{1}{2}q^t C_{mat}^{-1}q + V(\phi) \quad (3.13)$$

Obtaining the inverse matrix $C_{mat}^{-1}$ of the matrix $C_{mat}$ of 6 rows and 6 columns concretely, the Hamiltonian H is given as the following Equation (3.14).

$$H = \frac{1}{2(C_J + C)}\left[1 + \frac{C}{4C_J} + \frac{C^2}{4(C_J C + CC_g + C_g C_J)}\right]\sum_{i=1}^{4}q_i^2 + \quad (3.14)$$

$$\frac{C}{C_J + C}\left[\frac{C}{4C_J} + \frac{C}{4(C_J C + CC_g + C_g C_J)}\right](q_1 q_2 + q_3 q_4) +$$

$$\frac{CC_g}{4C_J(C_J C + CC_g + C_g C_J)}(q_1 + q_2)(q_3 + q_4) + \frac{1}{2C_J}\sum_{i=1}^{4}q_i q_{g+} +$$

$$\frac{C}{2(C_J C + CC_g + C_g C_J)}\sum_{i=1}^{4}s_i q_i q_{g-} + \left[\frac{1}{2C} + \frac{1}{2C_J}\right]q_{g+}^2 +$$

$$\frac{C_J + C}{2(C_J C + CC_g + C_g C_J)}q_{g-}^2 + V(\phi)$$

$$= \frac{1}{2C_J}\sum_{i=1}^{4}q_i^2 + \frac{1}{2C_J}\sum_{i=1}^{4}q_i q_{g+} + \frac{1}{2C_J}\frac{C''}{1 + C''}\sum_{i=1}^{4}s_i q_i q_{g-} +$$

$$\frac{1}{2C_J}\left(\frac{1}{C'} + 1\right)q_{g+}^2 + \frac{1}{2C_J}\left[\frac{C''}{(1 + C'')}\frac{1}{C'} + \frac{C''^2}{(1 + C'')^2}\right]q_{g-}^2 +$$

$$O(C') + V(\phi)$$

where, $$C' = C/C_J \quad (3.15)$$

$$C'' = C/C_g \quad (3.16)$$

-continued $$q_{g\pm} = \frac{q_{g1} \pm q_{g2}}{2} \tag{3.17}$$

$$s_1 = s_2 = 1, s_3 = s_4 = -1 \tag{3.18}$$

In Equation (3.14), the Expression at the bottom line, the following is assumed.

$$C' \ll 1 \tag{3.19}$$

When O(C') is neglected, a product between degrees of freedom of JPO does not appear. Details of calculations are given in section A. 1 of the appendix below.

2. QUANTIZATION

By converting variables $\phi$ and $q$ in the classical Hamiltonian to operators as follows, the Hamiltonian is replaced by a function of the operator (quantization of the Hamiltonian).

$$\phi_k \to \hat{\varphi}_k \tag{4.1}$$

$$q_k \to \hat{n}_k$$

$$H \to \hat{H}$$

$$\frac{\phi_k}{\phi_0} = \varphi_k \to \hat{\varphi}_k = \varphi_{kZ}(a_k + a_k^\dagger), \varphi_{kZ} = \sqrt{\frac{Z_k}{2}} \tag{4.2}$$

$$\frac{q_k}{2e} = n_k \to \hat{n}_k = -i n_{kZ}(a_k - a_k^\dagger), n_{kZ} = \sqrt{\frac{1}{2Z_k}} \tag{4.3}$$

where k=1, 2, 3, 4, g1, g2, and $a^\dagger_k$ and $a_k$ are creation and annihilation operators of boson. e is elementary electric charge (quantum of electricity). In this case, the following commutation relation (4.4) holds.

$$[\hat{\varphi}_k, \hat{n}_k] = i \tag{4.4}$$

$$Z_1, Z_2, Z_3, Z_4 = \sqrt{\frac{8E_C}{E_J}} \tag{4.5}$$

$$Z_{g1} = Z_{g2} = \sqrt{\frac{2E'_{Cg}}{E_{Jg}}} \tag{4.6}$$

In Equations (4.5) and (4.6), $$E_C = \frac{e^2}{2C_J} \tag{4.7}$$

$$E'_{Cg} = E_{Cg}\left[\frac{1}{1+C''} + \frac{C'C''}{(1+C'')^2}\right]$$

where $$E_{Cg} = \frac{e^2}{2C_g} \tag{4.8}$$

Since $Z_1$ and $Z_2$ are equal, $$\varphi_Z := \varphi_{1Z} = \varphi_{2Z} \tag{4.9}$$

We have $$n_Z := n_{1Z} = n_{2Z} \tag{4.10}$$

$$\varphi_{g\pm} = \varphi_{g1} \pm \varphi_{g2} \to \hat{\varphi}_{g\pm} = \hat{\varphi}_{g1} \pm \hat{\varphi}_{g2} = \varphi_{gZ}(a_{q\pm} + a_{g\pm}^\dagger) \tag{4.11}$$

$$\varphi_{gZ} = \sqrt{\frac{Z_g}{2}} \tag{4.12}$$

$$n_{g\pm} = \frac{n_{g1} \pm n_{g2}}{2} \to \hat{n}_{g\pm} = \frac{\hat{n}_{g1} \pm \hat{n}_{g2}}{2} = -i n_{gZ}(a_{g\pm} - a_{g\pm}^\dagger) \tag{4.13}$$

$$n_{gZ} = \sqrt{\frac{1}{2Z_g}} \tag{4.14}$$

In Equations (4.11) and (4.13), $$a_{g\pm} = \frac{a_{g1} \pm a_{g2}}{\sqrt{2}} \tag{4.15}$$

In Equations (4.12) and (4.14), $$Z_g = 2Z_{g1} = 2Z_{g2} = \sqrt{\frac{8E'_{Cg}}{E_{Jg}}} \tag{4.16}$$

Following holds as a commutator (commutation relation) of an operator.

$$[a_{g\pm}, a_{g\pm}^\dagger] = 1 \tag{4.17}$$

$$[\hat{\varphi}_{g\pm}, \hat{q}_{g\pm}] = i \tag{4.18}$$

Therefore, by quantizing the Hamiltonian of a classical system as above, the following is derived. A quantized Hamiltonian is written $H_Q$ instead of using a hat.

$$H \to H_Q = \tag{4.19}$$

$$-4E_C n_Z^2 \sum_{i=1}^{4}(a_i - a_i^\dagger)^2 - 4E_C n_Z n_{gZ} \sum_{i=1}^{4}(a_i - a_i^\dagger)(a_{g+} - a_{g+}^\dagger) -$$

$$4E_C \frac{C''}{1+C''} n_Z n_{gZ} \sum_{i=1}^{4} s_i(a_i - a_i^\dagger)(a_{g-} - a_{g-}^\dagger) -$$

$$4E_C\left(\frac{1}{C'} + 1\right) n_{gZ}^2 (a_{g+} - a_{g+}^\dagger)^2 - 4E_{Cg} n_{gZ}^2 (a_{g-} - a_{g-}^\dagger)^2 -$$

$$\sum_{i=1}^{4} E_J(\Phi_i)\left[1 - \frac{\varphi_Z^2}{2}(a_i + a_i^\dagger)^2 + \frac{\varphi_Z^4}{24}(a_i + a_i^\dagger)^4\right] -$$

$$E_{Jg}\left[1 - \frac{\varphi_{gZ}^2}{2}(a_{g-} + a_{g-}^\dagger)^2 + \frac{\varphi_{gZ}^4}{24}(a_{g-} + a_{g-}^\dagger)^4\right]$$

Here, O(C') is neglected and higher order terms in an expansion of $\cos(\phi_i/\phi_0)$ are neglected.

Next, let $\phi i$ be time-varying so that it can be approximated as follows (reference may be made to NPL 3).

$$E_J(\Phi_i) = E_J + \delta E_J \cos(\omega_{p,i} t) \tag{4.20}$$

As a quantized Hamiltonian $H_Q$, Equation (4.21) and following equations are derived.

$$H_Q = \sum_{i=1}^{4}\left[\omega a_i^\dagger a_i - \frac{E_c}{12}(a_i + a_i^+)^4 + \frac{\delta E_J \omega}{4E_J}(a_i + a_i^+)^2 \cos(\omega_{p,i}t)\right] + \tag{4.21}$$

$$g_+ \sum_{i=1}^{4}(a_i^+ - a_i)(a_{g_+} - a_{g_+}^+) + g_- \sum_{i=1}^{4}s_i(a_i^+ - a_i)(a_{g_-} - a_{g_-}^+) +$$

$$\omega_+ a_{g_+}^+ a_{g_+} - \frac{\omega_+}{2}(a_{g_+}^2 + a_{g_+}^{+2}) + \omega_- a_{g_-}^+ a_{g_-} - \frac{E_{Cg}'}{12}(a_{g_-} + a_{g_-}^+)^4$$

where, $$\omega = \sqrt{8E_C E_J} \tag{4.22}$$

$$\omega_+ = 4E_C\left(\frac{1}{C'} + 1\right)\sqrt{\frac{E_{Jg}}{8E_{Cg}'}} \cong \frac{C_g + C}{2C}\omega_- \tag{4.23}$$

$$\omega_- = \sqrt{8E_{Cg}' E_{Jg}} \tag{4.24}$$

$$g_+ = \frac{E_C}{\sqrt{2}}\left(\frac{E_J E_{Jg}}{E_C E_{Cg}'}\right)^{1/4} = \frac{\sqrt{\omega \omega_-}}{4}\sqrt{\frac{E_C}{E_{Cg}'}} \tag{4.25}$$

$$g_- = \frac{E_C}{\sqrt{2}}\left(\frac{E_J E_{Jg}}{E_C E_{Cg}'}\right)^{1/4} \frac{C''}{1 + C''} = \frac{\sqrt{\omega \omega_-}}{4}\sqrt{\frac{E_C}{E_{Cg}'}} \frac{C}{C_g + C} \tag{4.26}$$

In Equation (4.21), a constant term(s) are excluded.

In addition, $\delta E_J$ is treated as small and, therefore, $\delta E_J \phi^4{}_Z$ is neglected.

Furthermore, at the rightmost side of Equation (4.23), quantities as large as C' (=C/C$_J$) is neglected.

Next, a unitary transformation using a unitary matrix Ug of Equation (4.27) is applied on the Hamiltonian of Equation (4.21).

$$U_g = \exp\left\{-g_+'\left[\sum_{i=1}^{4}(a_i^+ a_{g_+} - a_i a_{g_+}^+)\right] - g_-'\left[\sum_{i=1}^{4}s_i(a_i^+ a_{g_-} - a_i a_{g_-}^+)\right]\right\} \tag{4.27}$$

In Equation (4.27), $$g_+' = \frac{g_+}{\omega - \omega_+} \tag{4.28}$$

$$g_-' = \frac{g_-}{\omega - \omega} \tag{4.29}$$

$s_i$ is given by Equation (3.18).

This unitary transformation is a transformation that incorporates an interaction $$\left(g_+(a_i^\dagger - a_i)(a_{g_+}^\dagger - a_{g_+}) \text{ etc.}\right)$$

between JPOs 1 to 4 and the coupler 21 in the HQ into the creation/annihilation operator a$^+$$_i$/a$_i$, etc.

In other words, it is a transformation that perturbatively incorporates an influence of the coupler 21 on JPO1 to JPO4.

After this unitary transformation, the creation/annihilation operator a$^+$$_i$/a$_i$ is transferred to the rotational coordinate system with oscillation frequency $\omega_{p,i}/2$. (<Note 1>: Since this is after the above unitary transformation, this a$_i$ is the degree of freedom of each JPO perturbatively incorporating influence of the coupler 21).

$$H'_{Q} := U_{\omega_p/2}^\dagger U_g^\dagger H_Q U_g U_{\omega_p/2} - iU_{\omega_p/2}^\dagger \dot{U}_{\omega_p/2} \tag{4.30}$$

$$U_{\omega_p/2} = \exp\left(-i\sum_{k=1}^{4}\frac{\omega_{p,k}t}{2}a_k^\dagger a_k\right) \tag{4.31}$$

will be examined. Here, angular frequencies of pump signals of JPO1 to JPO4 are set to satisfy the following Equation (4.32).

$$\omega_{p,1} + \omega_{p,2} = \omega_{p,3} + \omega_{p,4} \tag{4.32}$$

Then, assuming that $\omega_{p,k}$ is sufficiently large for a time scale of interest, a rotating wave approximation that neglects the oscillating term is performed.

At this time, $$U_{\omega_p/2}^\dagger a_k U_{\omega_p/2} = \exp\left(-\frac{i\omega_{p,k}t}{2}a_k\right) \tag{4.33}$$

is used.

$O(g'_+{}^2)$, etc., are neglected as small quantity. However, it is assumed that $g'_-{}^{-4}/C_g$ is not negligible as compared to other terms (e.g., $\Delta_i$ below).

We have the following Hamiltonian $H'_Q$. Details of calculations are given in section A.2.

$$H_Q' = \sum_{i=1}^{4}\left[\Delta_i a_i^\dagger a_i - \frac{K'}{2}a_i^{+2}a_i^2 + \frac{p}{2}(a_i^{+2} + a_i^2)\right] - \tag{4.34}$$

$$g^{(4)}\left(\sum_{k=1}^{3}\sum_{l=k+1}^{4}a_k^+ a_k a_l^+ a_l + a_1 a_2 a_3^+ a_4^+ + a_1^+ a_2^+ a_3 a_4\right) -$$

$$\frac{g^{(4)}}{2}\sum_{k=1}^{4}a_k^+ a_k(a_{g_-} + a_{g_-}^+)^2 + \omega'_- a_{g_-}^+ a_{g_-} +$$

$$\frac{\delta\omega'_g}{2}(a_{g_-}^{+2} + a_{g_-}^2) - g_{g_-}^{(4)}(a_{g_-} + a_{g_-}^+)^4$$

In Equation (4.34), $$\Delta_i = \omega + g_+ g_+' + g_- g_-' - \frac{\omega_{p,i}}{2} + E_C - 2E_{Cq}' g_-'^4 \tag{4.35}$$

$$K' = E_C + g_-'^4 E_{Cg}' \tag{4.36}$$

$$p = \frac{\delta E_J \omega}{4E_J} \tag{4.37}$$

$$g^{(4)} = 2g_-'^4 E_{Cg}' \tag{4.38}$$

-continued $$\omega'_- = \omega_- - 4g_- g'_- - 4g_-'^2 E'_{Cg} \qquad (4.39)$$

$$\delta\omega'_g = 8g_- g'_- - 4g_-'^2 E'_{Cg} \qquad (4.40)$$

$$g_{g-}^{(4)} = \frac{E'_{Cg}}{12} \qquad (4.41)$$

$g'_+$, $g'_-$, and $g^{(4)}$ are expressed using circuit parameters and resonance angular frequencies $\omega$ and $\omega_-$ as follows.

$$g'_+ = \frac{\sqrt{\omega\omega_-}}{4(\omega - \omega_+)} \sqrt{\frac{C_g + C}{C_J}} \qquad (4.42)$$

$$g'_- = \frac{\sqrt{\omega\omega_-}}{4(\omega - \omega_-)} \frac{C}{\sqrt{C_J(C_g + C)}} \qquad (4.43)$$

$$g^{(4)} = \frac{(\omega\omega_-)^2}{[4(\omega - \omega_-)]^4} \frac{C^4}{C_J^2(C_g + C)^3} e^2 \qquad (4.44)$$

Note that, since in a result of NPL 1 corresponding to Equation (4.44), $g^{(4)}$ diverges infinity at capacitance C→0, it is physically wrong. According to NPL 1, the strength of the four-body interaction is proportional to g1g2g3g4 (Equation (1.3) above), each gk (k=1 to 4) is expressed as (1/C) with respect to a coupling capacitor C between a coupler and a qubit (Equation (1.5) above), and strength of the four-body interaction in Equation (1.3) above diverges to infinity when coupling capacitor C→0.

3. CONCLUSION

In the circuit illustrated in FIG. 9, each JPO interacts with other JPOs through the coupler 21. To represent this as a direct interaction between JPOs, in the example embodiment, influence of the coupler 21 is perturbatively incorporated into JPOs. The JPO, which incorporates the influence of the coupler 21, realizes the four-body interaction. The following conditions are assigned in a calculation process.

(1)

$$C/CJ \ll 1$$

(2) g'+ and g' given by equations (4.43) and (4.44), respectively, satisfy the following relationship.

$$|g'_+|, |g'_-| \ll 1 \qquad \text{(See Note 2 below)}$$

(3) angular frequencies $\omega_{p,k}$ (k=1, 2, 3, 4) of pump signals respectively differ greatly, and the rotating wave approximation is valid.

These conditions have physically following meaning.

Condition (1) weakens direct interactions between/among JPOs performed without via the coupler 21.

Condition (2) causes the coupler 21 not to have a too strong influence and the JPO to have a behavior not deviating from that of the original JPO.

Condition (3) weakens an interaction (two-body interaction between JPOs and an interaction between the JPO and the coupler 21) other than the four-body interaction among JPOs into which the influence of coupler 21 is incorporated.

When the above conditions are met, the effective Hamiltonian of the circuit is given by Equation (4.34) and the coupling coefficient $g^{(4)}$ of the four-body interaction among JPOs is given by Equation (4.44).

<Note 2> Note that, when $$\omega_- \cong \omega \text{ and, } C/Cg \ll 1,$$

$$|g'_+| = \left| \frac{\omega - \omega_-}{\omega - \frac{C_g + C}{2C}\omega_-} \frac{C_g + C}{C} g'_- \right| \cong \left| \frac{2(\omega - \omega_-)}{\omega_-} g'_- \right| < |g'_-| \qquad (4.45)$$

holds. Thus, $$|g'_-| \ll 1 \qquad (4.46)$$

is a sufficient condition.

APPENDIX

In the following, details of the above derivation process are explained supplementally.

A. Calculation

<A.1 Capacitance>

$C_{mat}^{-1}$ in Equation (3.4) is an inverse matrix of the matrix $C_{mat}$, and a value $C_{ij}^{-1}$ of element (i,j) of the inverse matrix is as follows. Since $C_{mat}^{-1}$ is a symmetric matrix, only an upper triangular part of the matrix (including diagonal components) $C_{ij}^{-1}$ (j>=i) is shown.

$$C_{11}^{-1} = \qquad (A.1)$$
$$C_{22}^{-1} = C_{33}^{-1} = C_{44}^{-1} = \frac{1}{C_J + C} + \frac{1}{4C_J(C_J C + CC_g + C_g C_J)} \frac{C}{C_J + C}$$
$$(2C_J C + CC_g + C_g C_J) = \frac{1}{C_J + C}\left[1 + \frac{C}{4C_J} + \frac{C^2}{4(C_J C + CC_g + C_g C_J)}\right]$$

$$C_{12}^{-1} = \qquad (A.2)$$
$$C_{34}^{-1} = \frac{1}{4C_J(C_J C + CC_g + C_g C_J)} \frac{C}{C_J + C} (2C_J C + CC_g + C_g C_J) =$$
$$\frac{C}{C_J + C}\left[\frac{1}{4C_J} + \frac{C}{4(C_J C + CC_g + C_g C_J)}\right]$$

$$C_{13}^{-1} = C_{14}^{-1} = C_{23}^{-1} = C_{24}^{-1} = \frac{CC_g}{4C_J(C_J C + CC_g + C_g C_J)} \qquad (A.3)$$

$$C_{15}^{-1} = C_{25}^{-1} = C_{36}^{-1} = C_{46}^{-1} = \qquad (A.4)$$
$$\frac{1}{4C_J(C_J C + CC_g + C_g C_J)} (2C_J C + CC_g + C_g C_J) =$$
$$\frac{1}{4C_J} + \frac{C}{4(C_J C + CC_g + C_g C_J)}$$

$$C_{16}^{-1} = C_{26}^{-1} = C_{35}^{-1} = C_{45}^{-1} = \qquad (A.5)$$
$$\frac{1}{4C_J(C_J C + CC_g + C_g C_J)} (CC_g + C_g C_J) =$$
$$\frac{1}{4C_J} - \frac{C}{4(C_J C + CC_g + C_g C_J)}$$

$$C_{55}^{-1} = C_{66}^{-1} = \frac{1}{4C_J(C_J C + CC_g + C_g C_J)} \qquad (A.6)$$

-continued $$\frac{C_J + C}{C}(2C_J C + CC_g + C_g C_J) =$$

$$\frac{1}{4C} + \frac{1}{4C_J} + \frac{C_J + C}{4(C_J C + CC_g + C_g C_J)}$$

$$C_{56}^{-1} = \frac{1}{4C_J(C_J C + CC_g + C_g C_J)} \frac{C_J + C}{C}(CC_g + C_g C_J) = \tag{A.7}$$

$$\frac{1}{4C} + \frac{1}{4C_J} - \frac{C_J + C}{4(C_J C + CC_g + C_g C_J)}$$

Accordingly, the Hamiltonian (classical Hamiltonian) is given by following.

$$H = \frac{1}{2} C_{11}^{-1}(q_1^2 + q_2^2 + q_3^2 + q_4^2) + \tag{A.8}$$

$$C_{12}^{-1}(q_1 q_2 + q_3 q_4) + C_{13}^{-1}(q_1 q_3 + q_1 q_4 + q_2 q_3 + q_2 q_4) +$$

$$C_{15}^{-1}(q_1 q_{g_1} + q_2 q_{g_1} + q_3 q_{g_2} + q_4 q_{g_2}) +$$

$$C_{16}^{-1}(q_1 q_{g_2} + q_2 q_{g_2} + q_3 q_{g_1} + q_4 q_{g_1}) +$$

$$\frac{1}{2} C_{55}^{-1}(q_{g_1}^2 + q_{g_2}^2) + C_{56}^{-1} q_{g_1} q_{g_2} + V(\phi) =$$

$$\frac{1}{2} C_{11}^{-1} \sum_{i=1}^{4} q_i^2 + C_{12}^{-1}(q_1 q_2 + q_3 q_4) + C_{13}^{-1}(q_1 + q_2)(q_3 + q_4) +$$

$$\left(C_{15}^{-1} + C_{16}^{-1}\right) \sum_{i=1}^{4} q_i q_{g+} + \left(C_{15}^{-1} - C_{16}^{-1}\right) \sum_{i=1}^{4} s_i q_i q_{g-} +$$

$$\left(C_{55}^{-1} + C_{56}^{-1}\right) q_{g+}^2 + \left(C_{55}^{-1} - C_{56}^{-1}\right) q_{g-}^2 + V(\phi) =$$

$$\frac{1}{2(C_J + C)}\left[1 + \frac{C}{4C_J} + \frac{C^2}{4(C_J C + CC_g + C_g C_J)}\right] \sum_{i=1}^{4} q_i^2 +$$

$$\frac{C}{C_J + C}\left[\frac{C}{4C_J} + \frac{C}{4(C_J C + CC_g + C_g C_J)}\right](q_1 q_2 + q_3 q_4) +$$

$$\frac{CC_g}{4C_J(C_J C + CC_g + C_g C_J)}(q_1 + q_2)(q_3 + q_4) + \frac{1}{2C_J}\sum_{i=1}^{4} q_i q_{g+} +$$

$$\frac{C}{2(C_J C + CC_g + C_g C_J)} \sum_{i=1}^{4} s_i q_i q_{g-} + \left[\frac{1}{2C} + \frac{1}{2C_J}\right] q_{g+}^2 +$$

$$\frac{C_J + C}{2(C_J C + CC_g + C_g C_J)} q_{g-}^2 + V(\phi)$$

where, $$q_{q\pm} = \frac{q_{g1} \pm q_{g2}}{2} \tag{A.9}$$

$$s_1 = s_2 = 1, \, s_3 = s_4 = -1 \tag{A.10}$$

$$C' := C/C_J \tag{A.11}$$

$$C'' := C/C_g \tag{A.12}$$

and assume C'<<1.

$$C_{11}^{-1} = \frac{1}{C_J}\left[\frac{1}{1 + C'} + \frac{1}{4(C'' + C' + 1)} \frac{C'}{1 + C'}(2C'' + C' + 1)\right] = \tag{A.13}$$

$$\frac{1}{C_J}\left[1 - \frac{3 + 2C''}{4(1 + C'')}C' + O\left(C'^2\right)\right]$$

$$C_{12}^{-1} = \frac{1}{C_J} \frac{1}{4(C'' + C' + 1)} \frac{C'}{1 + C'}(2C'' + C' + 1) = \tag{A.14}$$

-continued $$\frac{1}{C_J}\left[\frac{1 + 2C''}{4(1 + C'')}C' + O\left(C'^2\right)\right]$$

$$C_{13}^{-1} = \frac{1}{C_J} \frac{1}{4(C'' + C' + 1)}C' = \frac{1}{C_J}\left[\frac{1}{4(1 + C'')}C' + O\left(C'^2\right)\right] \tag{A.15}$$

$$C_{15}^{-1} = \frac{1}{C_J} \frac{1}{4(C'' + C' + 1)}(2C'' + C' + 1) = \tag{A.16}$$

$$\frac{1}{C_J}\left[\frac{1 + 2C''}{4(1 + C'')} - \frac{C''}{4(1 + C'')^2}C' + O\left(C'^2\right)\right]$$

$$C_{16}^{-1} = \frac{1}{C_J} \frac{1}{4(C'' + C' + 1)}(C' + 1) = \tag{A.17}$$

$$\frac{1}{C_J}\left[\frac{1}{4(1 + C'')} + \frac{C''}{4(1 + C'')^2}C' + O\left(C'^2\right)\right]$$

$$C_{55}^{-1} = \frac{1}{C_J} \frac{1}{4(C'' + C' + 1)} \frac{1 + C'}{C'}(2C'' + C' + 1) = \tag{A.18}$$

$$\frac{1}{C_J}\left[\frac{1 + 2C''}{4(1 + C'')} \frac{1}{C'} + \frac{1}{2} - \frac{1 + 2C''}{4(1 + C'')^2} - \frac{C''^2}{4(1 + C'')^3}C' + O\left(C'^2\right)\right]$$

$$C_{56}^{-1} = \frac{1}{C_J} \frac{1}{4(C'' + C' + 1)} \frac{1 + C'}{C'}(C' + 1) = \tag{A.19}$$

$$\frac{1}{C_J}\left[\frac{1}{4(1 + C'')} \frac{1}{C'} + \frac{1 + 2C''}{4(1 + C'')^2} + \frac{C''^2}{4(1 + C'')^3}C' + O\left(C'^2\right)\right]$$

The Hamiltonian H is derived as the following Equation (A.20).

$$H = \frac{1}{2C_J}\left[1 - \frac{3 + 2C''}{4(1 + C'')}C'\right] \sum_{i=1}^{4} q_i^2 + \frac{1}{C_J} \frac{1 + 2C''}{4(1 + C'')}C'(q_1 q_2 + q_3 q_4) + \tag{A.20}$$

$$\frac{1}{C_J} \frac{1}{4(1 + C'')}C'(q_1 + q_2)(q_3 + q_4) + \frac{1}{2C_J} \sum_{i=1}^{4} q_i q_{g+} +$$

$$\frac{1}{2C_J}\left[\frac{C''}{1 + C''} - \frac{C''}{(1 + C'')^2}C'\right] \sum_{i=1}^{4} s_i q_i q_{g-} + \frac{1}{2C_J}\left(\frac{1}{C'} + 1\right) q_{g+}^2 +$$

$$\frac{1}{2C_J}\left[\frac{C''}{1 + C''} \frac{1}{C'} + \frac{C''^2}{(1 + C'')^2} - \frac{C''^2}{(1 + C'')^3}C'\right] q_{g-}^2 + O\left(C'^2\right) + V(\phi) =$$

$$\frac{1}{2C_J}\sum_{i=1}^{4} q_i^2 + \frac{1}{2C_J}\sum_{i=1}^{4} q_i q_{g+} + \frac{1}{2C_J} \frac{C''}{1 + C''} \sum_{i=1}^{4} s_i q_i q_{g-} + \frac{1}{2C_J}$$

$$\left(\frac{1}{C'} + 1\right) q_{g+}^2 + \frac{1}{2C_J}\left[\frac{C''}{1 + C''} \frac{1}{C'} + \frac{C''^2}{(1 + C'')^2}\right] q_{g-}^2 + O\left(C'\right) + V(\phi)$$

<A.2 Unitary Transformation>

Next, the following examines how each operator is transformed by a matrix Ug [Equation (4.27)] of the unitary transformation.

$$G = -g'_+ \sum_{i=1}^{4}\left(a_i^+ a_{g+} - a_i a_{g+}^+\right) - g'_- \sum_{i=1}^{4} s_i\left(a_i^+ a_{g-} - a_i a_{g-}^+\right) \tag{A.21}$$

Here, $s_i$ is as in Equation (3.18).
Let $$f_i(\lambda) = e^{-\lambda G} a_i e^{\lambda G} \tag{A.22}$$

$f_i(1)$ may be calculated. Therefore, a Taylor expansion of $f_i(\lambda)$ is performed around $\lambda=0$ and set $\lambda=1$.

$$f_i'(\lambda) = \frac{df_i(\lambda)}{d\lambda} = [f_i(\lambda), G] \tag{A.23}$$

and $$f_i^{(n)}(\lambda) = \left[f_i^{(n-1)}(\lambda), G\right] \tag{A.24}$$

are used.

For these calculations, the following relations (A.25) to (A.28) are used.

$$[a_1, G] = [a_2, G] = -g_+' a_{g+} - g_-' a_{g-} \tag{A.25}$$

$$[a_3, G] = [a_4, G] = -g_+' a_{g+} + g_-' a_{g-} \tag{A.26}$$

$$[a_{g+}, G] = g_+' \sum_{i=1}^{4} a_i \tag{A.27}$$

$$[a_{g-}, G] = g_-' \sum_{i=1}^{4} s_i a_i \tag{A.28}$$

With these relationships, the following equations (A.29) to (A.34) are obtained. Here, $O(g_+'^3)$ and other factors are neglected.

$$U_g^+ a_1 U_g \cong a_1 - g_+' a_{g+} - g_-' a_{g-} - \frac{g_+'^2}{2}\sum_{i=1}^{4} a_i - \frac{g_-'^2}{2}\sum_{i=1}^{4} s_i a_i \tag{A.29}$$

$$U_g^+ a_2 U_g \cong a_2 - g_+' a_{g+} - g_-' a_{g-} - \frac{g_+'^2}{2}\sum_{i=1}^{4} a_i - \frac{g_-'^2}{2}\sum_{i=1}^{4} s_i a_i \tag{A.30}$$

$$U_g^+ a_3 U_g \cong a_3 - g_+' a_{g+} + g_-' a_{g-} - \frac{g_+'^2}{2}\sum_{i=1}^{4} a_i + \frac{g_-'^2}{2}\sum_{i=1}^{4} s_i a_i \tag{A.31}$$

$$U_g^+ a_4 U_g \cong a_4 - g_+' a_{g+} + g_-' a_{g-} - \frac{g_+'^2}{2}\sum_{i=1}^{4} a_i + \frac{g_-'^2}{2}\sum_{i=1}^{4} s_i a_i \tag{A.32}$$

$$U_g^+ a_{g+} U_g \cong a_{g+} + g_+' \sum_{i=1}^{4} a_i - 2g_+'^2 a_{g+} \tag{A.33}$$

$$U_g^+ a_{g-} U_g \cong a_{g-} + g_-' \sum_{i=1}^{4} s_i a_i - 2g_-'^2 a_{g-} \tag{A.34}$$

Transformation $U\omega_{p/2}$ [Equation (4.31)] to a rotational coordinate system is also performed.

Then, by the two transformations, for example, $a_i^+ a_i$ is transformed as follows.

$$U_{\frac{\omega_p}{2}}^+ U_g^+ a_i^+ a_i U_g U_{\frac{\omega_p}{2}} = a_i^+ a_i - g_+'\left(e^{\frac{i\omega_{p,i}t}{2}} a_i^+ a_{g+} + a_{g+}^+ e^{-\frac{i\omega_{p,i}t}{2}} a_i\right) - \tag{A.35}$$

$$g_-' s_i\left(e^{\frac{i\omega_{p,i}t}{2}} a_i^+ a_{g-} + a_{g-}^+ e^{-\frac{i\omega_{p,i}t}{2}} a_i\right) +$$

$$g_+'^2\left(-e^{\frac{i\omega_{p,i}t}{2}} a_i^+ \frac{1}{2}\sum_{k=1}^{4} e^{-\frac{i\omega_{p,k}t}{2}} a_k - \right.$$

$$\frac{1}{2}\sum_{k=1}^{4} e^{\frac{i\omega_{p,k}t}{2}} a_k^+ e^{-\frac{i\omega_{p,i}t}{2}} a_i + a_{g+}^+ a_{g+}\right) +$$

$$g_-'^2\left(-e^{\frac{i\omega_{p,i}t}{2}} a_i^+ \frac{1}{2}\sum_{k=1}^{4} s_k e^{-\frac{i\omega_{p,k}t}{2}} a_k - \frac{1}{2}\sum_{k=1}^{4} s_k e^{\frac{i\omega_{p,k}t}{2}} a_k^+ e^{-\frac{i\omega_{p,i}t}{2}} a_i + \right.$$

$$\left. a_{g-}^+ a_{g-}\right) + g_+' g_-' s_i\left(a_{g+}^+ a_{g-} + a_{g-}^+ a_{g+}\right) + O(g'^3) =$$

-continued $$\left(1 - g_+'^2 - g_-'^2\right)a_i^+ a_i + g_+'^2 a_{g+}^+ a_{g+} + g_-'^2 a_{g-}^+ a_{g-} + $$

$$g_+' g_-' s_i\left(a_{g+}^+ a_{g-} + a_{g-}^+ a_{g+}\right) + O(g'^3) + \text{(oscillating terms)}$$

where an oscillating term(s), which is a term(s) oscillating at each oscillation frequency $\omega_{p,i}$, such as $\exp(i\omega_{p,i}t)$, is/are neglected under the rotating wave approximation.

In the following, transformation of each of the other terms in the quantized Hamiltonian $H_Q$ [Equation (4.21)] is shown. Here, in $H_Q$, as for terms, where $\omega$, $\omega_+$, and $\omega_-$ are coefficient (such as $a_{g+}^+ a_{g+}$) thereof, up to terms, where $g_+'^2$ and $g_-'^2$ are coefficient thereof, are shown concretely after the transformation. In the transformation of $(a_{g-}+a_{+g-})^4$, terms up to a term where $g'^4$ is a coefficient thereof, is shown concretely. For other terms before transformation, etc., after $O(g_+'^2)$, transformation is not shown. The transformation is as follows.

$$U_{\frac{\omega_p}{2}}^+ U_g^+ (a_i + a_i^+)^4 U_g U_{\frac{\omega_p}{2}} = \left(e^{-\frac{i\omega_{p,i}t}{2}} a_i + e^{\frac{i\omega_{p,i}t}{2}} a_i^+\right)^4 + \tag{A.36}$$

$$\left(e^{-\frac{i\omega_{p,i}t}{2}} a_i + e^{\frac{i\omega_{p,i}t}{2}} a_i^+\right)^3\left[-g_+'\left(a_{g+} + a_{g+}^+\right) - s_i g_-'\left(a_{g-} + a_{g-}^+\right)\right] + $$

$$O(g'^2) = 6a_i^{+2} a_i^2 - 12\, a_i^+ a_i + 3 + O(g'^2) + \text{(oscillating terms)}$$

where $$\left(e^{-\frac{i\omega_{p,i}t}{2}} a_i + e^{\frac{i\omega_{p,i}t}{2}} a_i^+\right)^4 = 6a_i^{+2} a_i^2 - 12\, a_i^+ a_i + 3 + \text{(oscillating terms)} \tag{A.37}$$

is used.

$$U_{\frac{\omega_p}{2}}^+ U_g^+ (a_i + a_i^+)^2 U_g U_{\frac{\omega_p}{2}} \cos(\omega_{p,i}t) = \tag{A.38}$$

$$\frac{1}{2}\left(a_i^2 + a_i^{+2}\right) + \text{(oscillating terms)}$$

$$U_{\frac{\omega_p}{2}}^+ U_g^+ (a_i^+ - a_i)(a_{g+} - a_{g+}^+) U_g U_{\frac{\omega_p}{2}} = \tag{A.39}$$

$$\left(e^{\frac{i\omega_{p,i}t}{2}} a_i^+ - e^{-\frac{i\omega_{p,i}t}{2}} a_i\right)(a_{g+} - a_{g+}^+) + $$

$$g_+'\left[\left(e^{\frac{i\omega_{p,i}t}{2}} a_i^+ - e^{-\frac{i\omega_{p,i}t}{2}} a_i\right)\sum_{k=1}^{4}\left(e^{-\frac{i\omega_{p,k}t}{2}} a_k - e^{\frac{i\omega_{p,k}t}{2}} a_k^+\right)\right] - $$

$$\left(a_{g+}^+ - a_{g+}\right)\left(a_{g+} - a_{g+}^+\right)\right] - s_i g_-'\left(a_{g-}^+ - a_{g-}\right)\left(a_{g+} - a_{g+}^+\right) + O(g'^2) = $$

$$g_+'\left[2a_i^+ a_i + 1 + \left(a_{g+}^+ - a_{g+}\right)^2\right] + s_i g_-'\left(a_{g+}^+ - a_{g+}\right)\left(a_{g-}^+ - a_{g-}\right) + $$

$$O(g'^2) + \text{(oscillating terms)}$$

$$U_{\frac{\omega_p}{2}}^+ U_g^+ (a_i^+ - a_i)(a_{g-} - a_{g-}^+) U_g U_{\frac{\omega_p}{2}} = \tag{A.40}$$

$$\left(e^{\frac{i\omega_{p,i}t}{2}} a_i^+ - e^{-\frac{i\omega_{p,i}t}{2}} a_i\right)(a_{g-} - a_{g-}^+) - g_+'\left(a_{g+}^+ - a_{g+}\right)(a_{g-} - a_{g-}^+) + $$

$$g_-'\left[\left(e^{\frac{i\omega_{p,i}t}{2}} a_i^+ - e^{-\frac{i\omega_{p,i}t}{2}} a_i\right)\sum_{k=1}^{4} s_k\left(e^{-\frac{i\omega_{p,k}t}{2}} a_k - e^{\frac{i\omega_{p,k}t}{2}} a_k^+\right)\right] - $$

$$s_i\left(a_{g-}^+ - a_{g-}\right)\left(a_{g-} - a_{g-}^+\right)\right] + O(g'^2) = g_+'\left(a_{g+}^+ - a_{g+}\right)\left(a_{g-}^+ - a_{g-}\right) + $$

$$s_i g_-'\left[2a_i^+ a_i + 1 + \left(a_{g-}^+ - a_{g-}\right)^2\right] + O(g'^2) + \text{(oscillating terms)}$$

-continued $$U^+_{\frac{\omega_p}{2}} U^+_g a^+_{g+} a_{g+} U_g U_{\frac{\omega_p}{2}} = \tag{A.41}$$

$$a^+_{g+} a_{g+} + g'_+ \left( a^+_{g+} \sum_{k=1}^4 e^{-\frac{i\omega_{p,k}t}{2}} a_k + \sum_{k=1}^4 e^{\frac{i\omega_{p,k}t}{2}} a^+_k a_{g+} \right) +$$

$$g'^2_+ \left( -4a^+_{g+} a_{g+} + \sum_{k=1}^4 e^{\frac{i\omega_{p,k}t}{2}} a^+_k \sum_{l=1}^4 e^{-\frac{i\omega_{p,l}t}{2}} a_l \right) + O(g'^3) =$$

$$(1 - 4g'^2_+)a^+_{g+} a_{g+} + g'^2_+ \sum_{k=1}^4 a^+_k a_k + O(g'^3) + \text{(oscillating terms)}$$

$$U^+_{\frac{\omega_p}{2}} U^+_g a^2_{g+} U_g U_{\frac{\omega_p}{2}} = a^2_{g+} + 2g'_+ a_{g+} \sum_{k=1}^4 e^{\frac{i\omega_{p,k}t}{2}} a_k + \tag{A.42}$$

$$g'^2_+ \left( -4a^2_{g+} + \sum_{k=1}^4 e^{\frac{i\omega_{p,k}t}{2}} a_k \sum_{l=1}^4 e^{-\frac{i\omega_{p,l}t}{2}} a_l \right) + O(g'^3) =$$

$$(1 - 4g'^2_+)a^2_{g+} + O(g'^3) + \text{(oscillating terms)}$$

$$U^+_{\frac{\omega_p}{2}} U^+_g a^+_{g-} a_{g-} U_g U_{\frac{\omega_p}{2}} = \tag{A.43}$$

$$a^+_{g-} a_{g-} + g'_- \left( a^+_{g-} \sum_{k=1}^4 s_k e^{-\frac{i\omega_{p,k}t}{2}} a_k + \sum_{k=1}^4 s_k e^{\frac{i\omega_{p,k}t}{2}} a^+_k a_{g-} \right) +$$

$$g'^2_- \left( -4a^+_{g-} a_{g-} + \sum_{k=1}^4 e^{\frac{i\omega_{p,k}t}{2}} a_k + \sum_{l=1}^4 e^{-\frac{i\omega_{p,l}t}{2}} a_l \right) + O(g'^3) =$$

$$(1 - 4g'^2_-)a^+_{g-} a_{g-} + g'^2_- \sum_{k=1}^4 a^+_k a_k + O(g'^3) + \text{(oscillating terms)}$$

$$U^+_{\frac{\omega_p}{2}} U^+_g (a_{g-} + a^+_{g-})^4 U_g U_{\frac{\omega_p}{2}} = \tag{A.44}$$

$$(a_{g-} + a^+_{g-})^4 + g'_- (a_{g-} + a^+_{g-})^3 \sum_{k=1}^4 s_k \left( e^{-\frac{i\omega_{p,k}t}{2}} a_k + e^{\frac{i\omega_{p,k}t}{2}} a^+_k \right) +$$

$$g'^2_- \left\{ -2\binom{4}{1}(a_{g-} + a^+_{g-})^4 + \right.$$

$$\left. \binom{4}{2}(a_{g-} + a^+_{g-})^2 \left[ \sum_{k=1}^4 s_k \left( e^{-\frac{i\omega_{p,k}t}{2}} a_k + e^{\frac{i\omega_{p,k}t}{2}} a^+_k \right) \right]^2 \right\} +$$

$$g'^3_- \left\{ -2\binom{4}{2}(a_{g-} + a^+_{g-})^3 \sum_{k=1}^4 s_k \left( e^{-\frac{i\omega_{p,k}t}{2}} a_k + e^{\frac{i\omega_{p,k}t}{2}} a^+_k \right) + \right.$$

$$\left. \binom{4}{1}(a_{g-} + a^+_{g-}) \left[ \sum_{k=1}^4 s_k \left( e^{-\frac{i\omega_{p,k}t}{2}} a_k + e^{\frac{i\omega_{p,k}t}{2}} a^+_k \right) \right]^3 \right\} +$$

$$g'^4_- \left\{ (-2)^2 \binom{4}{2}(a_{g-} + a^+_{g-})^4 + \left[ \sum_{k=1}^4 s_k \left( e^{-\frac{i\omega_{p,k}t}{2}} a_k + e^{\frac{i\omega_{p,k}t}{2}} a^+_k \right) \right]^4 \right\} +$$

$$O(g'^5) =$$

$$(a_{g-} + a^+_{g-})^4 + g'^2_- \left[ -8(a_{g-} + a^+_{g-})^4 + 6(a_{g-} + a^+_{g-})^2 \sum_{k=1}^4 (2a^+_k a_k + 1) \right] +$$

$$g'^4_- \left\{ 24(a_{g-} + a^+_{g-})^4 + \left[ \sum_{k=1}^4 s_k \left( e^{-\frac{i\omega_{p,k}t}{2}} a_k + e^{\frac{i\omega_{p,k}t}{2}} a^+_k \right) \right]^4 \right\} +$$

$$O(g'^5) + \text{(oscillating terms)} = 24g'^2_-(a_{g-} + a^+_{g-})^2 +$$

$$(1 - 8g'^2_- + 24g'^4_-)(a_{g-} + a^+_{g-})^4 + 12g'^2_-(a_{g-} + a^+_{g-})^2 \sum_{k=1}^4 a^+_k a_k +$$

$$g'^4_- \left[ \sum_{k=1}^4 s_k \left( e^{-\frac{i\omega_{p,k}t}{2}} a_k + e^{\frac{i\omega_{p,k}t}{2}} a^+_k \right) \right]^4 + O(g'^5) + \text{(oscillating terms)}$$

where $$\binom{x}{y} = \frac{x!}{y!(x-y)!} \tag{A.45}$$

$$\left[ \sum_{k=1}^4 s_k \left( e^{-\frac{i\omega_{p,k}t}{2}} a_k + e^{\frac{i\omega_{p,k}t}{2}} a^+_k \right) \right]^4 = \tag{A.46}$$

$$\sum_{k=1}^4 \left( e^{-\frac{i\omega_{p,k}t}{2}} a_k + e^{\frac{i\omega_{p,k}t}{2}} a^+_k \right)^4 \text{(oscillating terms)}, +$$

$$\binom{4}{2} \sum_{k=1}^3 \sum_{l=k+1}^4 \left( e^{-\frac{i\omega_{p,k}t}{2}} a_k + e^{\frac{i\omega_{p,k}t}{2}} a^+_k \right)^2$$

$$\left( e^{\frac{i\omega_{p,l}t}{2}} a_l + e^{-\frac{i\omega_{p,l}t}{2}} a^+_l \right)^2 \text{(oscillating terms)}, +$$

$$4! \prod_{k=1}^4 \left( e^{-\frac{i\omega_{p,k}t}{2}} a_k + e^{\frac{i\omega_{p,k}t}{2}} a^+_k \right) + \text{(oscillating terms)} =$$

$$\sum_{k=1}^4 \left( 6a^{+2}_k a^2_k - 12a^+_k a_k + 3 \right) + 6 \sum_{k=1}^3 \sum_{l=k+1}^4 (2a^+_k a_k + 1)(2a^+_l a_l + 1) +$$

$$24(a_1 a_2 a^+_3 a^+_4 + a^+_1 a^+_2 a_3 a_4) + \text{(oscillating terms)} =$$

$$12 + 24 \sum_{k=1}^4 a^+_k a_k + 6 \sum_{k=1}^4 a^{+2}_k a^2_k + 24 \sum_{k=1}^3 \sum_{l=k+1}^4 a^+_k a_k a^+_l a_l +$$

$$24(a_1 a_2 a^+_3 a^+_4 + a^+_1 a^+_2 a_3 a_4) + \text{(oscillating terms)}$$

By substituting this into Equation (A.44) above, the following is obtained.

$$U^+_{\frac{\omega_p}{2}} U^+_g (a_{g-} + a^+_{g-})^4 U_g U_{\frac{\omega_p}{2}} = 24g'^2_-(a_{g-} + a^+_{g-})^2 + \tag{A.47}$$

$$(1 - 8g'^2_- + 24g'^4_-)(a_{g-} + a^+_{g-})^4 + 12g'^2_-(a_{g-} + a^+_{g-})^2 \sum_{k=1}^4 a^+_k a_k +$$

$$g'^4_- \left[ 24 \sum_{k=1}^4 a^+_k a_k + 6 \sum_{k=1}^4 a^{+2}_k a^2_k + 24 \sum_{k=1}^3 \sum_{l=k+1}^4 a^+_k a_k a^+_l a_l + \right.$$

$$\left. 24(a_1 a_2 a^+_3 a^+_4 + a^+_1 a^+_2 a_3 a_4) \right] + O(g'^5) + \text{(oscillating terms)} + 12g'^4_-$$

Next, using Equations (A.35), (A.39), (A.40), (A.41), and (A.43), the unitary transformation of the following sum included in the $H_Q$ [Equation (4.21)] is examined.

$$H_{Q0} = \sum_{i=1}^4 \omega a^+_i a_i + g_+ \sum_{i=1}^4 (a^+_i - a_i)(a_{g+} - a^+_{g+}) + \tag{A.48}$$

$$g_- \sum_{i=1}^4 s_i (a^+_i - a_i)(a_{g-} - a^+_{g-}) + \omega_+ a^+_{g+} a_{g+} + \omega_- a^+_{g-} a_{g-}$$

Note

-continued $$g'_+ = \frac{g_+}{\omega - \omega_+} \tag{A.49}$$

$$g'_- = \frac{g_-}{\omega - \omega_-} \tag{A.50}$$

$$\sum_{i=1}^{4} s_i = 0 \tag{A.51}$$

Hereinafter, $O(g'^2)$ and oscillating terms are all neglected.

$$U_{\frac{\omega_p}{2}}^+ U_g^+ H_{Q0} U_g U_{\frac{\omega_p}{2}} = \tag{A.52}$$

$$\omega \sum_{i=1}^{4} [(1 - g'^2_+ - g'^2_-)a_i^+ a_i +$$

$$g'^2_+ a_{g_+}^+ a_{g_+} + g'^2_- a_{g_-}^+ a_{g_-} + g'_+ g'_- s_i (a_{g_+}^+ a_{g_-} + a_{g_-}^+ a_{g_+})] + g_+$$

$$\sum_{i=1}^{4} \{ g'_+ [2a_i^+ a_i + 1 + (a_{g_+}^+ - a_{g_+})^2] + s_i g'_- (a_{g_+}^+ - a_{g_+})(a_{g_-}^+ - a_{g_-}) \} + g_-$$

$$\sum_{i=1}^{4} s_i \{ g'_+ (a_{g_+}^+ - a_{g_+})(a_{g_-}^+ - a_{g_-}) + s_i g'_- [2a_i^+ a_i + 1 + (a_{g_-}^+ - a_{g_-})^2] \} +$$

$$\omega_+ \left[ (1 - 4g'^2_+)a_{g_+}^+ a_{g_+} + g'^2_+ \sum_{k=1}^{4} a_k^+ a_k \right] +$$

$$\omega_- \left[ (1 - 4g'^2_-)a_{g_-}^+ a_{g_-} + g'^2_- \sum_{k=1}^{4} a_k^+ a_k \right] =$$

$$\sum_{i=1}^{4} (\omega + g_+ g'_+ + g_- g'_-)a_i^+ a_i + (\omega_+ + 4g_+ g'_+)a_{g_+}^+ a_{g_+} +$$

$$(\omega_- + 4g_- g'_-)a_{g_-}^+ a_{g_-} + 4g_+ g'_+ (a_{g_+}^+ - a_{g_+})^2 +$$

$$4g_+ g'_+ + 4g_- g'_- (a_{g_-}^+ - a_{g_-})^2 + 4g_- g'_- =$$

$$\sum_{i=1}^{4} (\omega + g_+ g'_+ + g_- g'_-)a_i^+ a_i + (\omega_+ - 4g_+ g'_+)a_{g_+}^+ a_{g_+} +$$

$$(\omega_- - 4g_- g'_-)a_{g_-}^+ a_{g_-} + 4g_+ g'_+ (a_{g_+}^{+2} + a_{g_+}^2) + 4g_- g'_- (a_{g_-}^{+2} + a_{g_-}^2)$$

The quantized Hamiltonian $H_Q$ [Equation (4.21)] is obtained from Equations (A.34), (A.36), (A.42), (A.47), and (A.52).

$$U_{\frac{\omega_p}{2}}^+ U_g^+ H_Q U_g U_{\frac{\omega_p}{2}} - i U_{\frac{\omega_p}{2}}^+ \dot{U}_{\frac{\omega_p}{2}} = \tag{A.53}$$

$$U_{\frac{\omega_p}{2}}^+ U_g^+ \left\{ H_{Q0} + \sum_{i=1}^{4} \left[ -\frac{E_C}{12}(a_i + a_i^+)^4 + \frac{\delta E_J \omega}{4E_J}(a_i + a_i^+)^2 \cos(\omega_{p,i} t) \right] - \right.$$

$$\frac{\omega_+}{2}(a_{g_+}^2 + a_{g_+}^{+2}) - \frac{E'_{Cg}}{12}(a_{g_-} + a_{g_-}^+)^4 \right\} U_g U_{\frac{\omega_p}{2}} - \sum_{i=1}^{4} \frac{\omega_{p,i}}{2} a_i^+ a_i =$$

$$\sum_{i=1}^{4} (\omega + g_+ g'_+ + g_- g'_-)a_i^+ a_i + (\omega_+ - 4g_+ g'_+)a_{g_+}^+ a_{g_+} +$$

$$(\omega_- - 4g_- g'_-)a_{g_-}^+ a_{g_-} + 4g_+ g'_+ (a_{g_+}^{+2} + a_{g_+}^2) + 4g_- g'_- (a_{g_-}^{+2} + a_{g_-}^2) +$$

$$\sum_{i=1}^{4} \left[ -\frac{E_C}{12}(6a_i^{+2} a_i^2 - 12a_i^+ a_i) + \frac{\delta E_J \omega}{4E_J} \frac{1}{2}(a_i^{+2} + a_i^2) \right] -$$

$$\frac{\omega_+}{2}(1 - 4g'^2_+)(a_{g_+}^{+2} + a_{g_+}^2) -$$

-continued $$\frac{E'_{Cg}}{12} \left\{ 24g'^2_-(a_{g_-} + a_{g_-}^+)^2 + (1 - 8g'^2_- + 24g'^4_-)(a_{g_-} + a_{g_-}^+)^4 + \right.$$

$$12g'^2_-(a_{g_-} + a_{g_-}^+)^2 \sum_{k=1}^{4} a_k^+ a_k + g'^4_- \left[ 24 \sum_{k=1}^{4} a_k^+ a_k + 6 \sum_{k=1}^{4} a_k^{+2} a_k^2 + \right.$$

$$\left. 24 \sum_{k=1}^{3} \sum_{l=k+1}^{4} a_k^+ a_k a_l^+ a_l + 24(a_1 a_2 a_3^+ a_4^+ + a_1^+ a_2^+ a_3 a_4) \right] \right\} - \sum_{i=1}^{4} \frac{\omega_{p,i}}{2} a_i^+ a_i =$$

$$\sum_{i=1}^{4} \left[ \left( \omega + g_+ g'_+ + g_- g'_- - \frac{\omega_{p,i}}{2} + E_C - 2g'^4_- E'_{Cg} \right)a_i^+ a_i - \right.$$

$$\left( \frac{E_C}{2} + \frac{g'^4_- E'_{Cg}}{2} \right)a_i^{+2} a_i^2 + \frac{\delta E_J \omega}{8E_J}(a_i^{+2} + a_i^2) \right] -$$

$$2g'^4_- E'_{Cg} \left( \sum_{k=1}^{3} \sum_{l=k+1}^{4} a_k^+ a_k a_l^+ a_l + a_1 a_2 a_3^+ a_4^+ + a_1^+ a_2^+ a_3 a_4 \right) -$$

$$g'^4_- E'_{Cg} \sum_{k=1}^{4} a_k^+ a_k (a_{g_-} + a_{g_-}^+)^2 + (\omega_+ - 4g_+ g'_+)a_{g_+}^+ a_{g_+} +$$

$$(\omega_- - 4g_- g'_- - 4g'^4_- E'_{Cg})a_{g_-}^+ a_{g_-} + \left[ 4g_+ g'_+ - \frac{\omega_+}{2}(1 - 4g'^2_+) \right]$$

$$(a_{g_+}^{+2} + a_{g_+}^2) + [4g_- g'_- - 2g'^4_- E'_{Cg}](a_{g_-}^{+2} + a_{g_-}^2) - \frac{E'_{Cg}}{12}(1 + O(g'^2_-))$$

$$(a_{g_-} + a_{g_-}^+)^4 = \sum_{i=1}^{4} \left[ \Delta_i a_i^+ a_i - \frac{K'}{2} a_i^{+2} a_i^2 + \frac{p}{2}(a_i^{+2} + a_i^2) \right] -$$

$$g^{(4)} \left( \sum_{k=1}^{3} \sum_{l=k+1}^{4} a_k^+ a_k a_l^+ a_l + a_1 a_2 a_3^+ a_4^+ + a_1^+ a_2^+ a_3 a_4 \right) -$$

$$\frac{g^{(4)}}{2} \sum_{k=1}^{4} a_k^+ a_k (a_{g_-} + a_{g_-}^+)^2 + \omega'_+ a_{g_+}^+ a_{g_+} + \omega'_- a_{g_-}^+ a_{g_-} -$$

$$\frac{\omega'_+}{2}(a_{g_+}^{+2} + a_{g_+}^2) + \frac{\delta \omega'_g}{2}(a_{g_-}^{+2} + a_{g_-}^2) - g_{g_-}^{(4)}(a_{g_-} + a_{g_-}^+)^4$$

In deriving Equation (A.53), the following equations (A.54) to (A.62) are used.

$$\Delta_i = \omega + g_+ g'_+ + g_- g'_- - \frac{\omega_{p,i}}{2} + E_C - 2E'_{Cg}g'^4_- \tag{A.54}$$

$$K' = E_C + g'^4_- E'_{Cg} \tag{A.55}$$

$$p = \frac{\delta E_J \omega}{4E_J} \tag{A.56}$$

$$g^{(4)} = 2g'^4_- E'_{Cg} \tag{A.57}$$

$$\omega'_+ = \omega_+ - 4g_+ g'_+ \tag{A.58}$$

$$\omega'_- = \omega_- - 4g_- g'_- - 4g'^2_- E'_{Cg} \tag{A.59}$$

$$\delta \omega'_g = 8g_- g'_- - 4g'^2_- E'_{Cg} \tag{A.60}$$

$$g_{g_-}^{(4)} = \frac{E'_{Cg}}{12} \tag{A.61}$$

where $$\omega_+ g'^2_+ = \frac{\omega_+}{\omega - \omega_+} g_+ g'_+ = -g_+ g'_+ + \omega g'^2_+ \tag{A.62}$$

Note that $a_{g_+}$ and $a^+_{g_+}$ are not products of $a_i$ and $a^+_i$, so there is no need to pay attention to them. Equation (4.34) is obtained by eliminating terms $a_{g_+}$ and $a^+_{g_+}$.

A general flow of the derivation of the four-body interaction among JPOs described above can be said to be similar to the study by Puri et al [NPL 1]. However, the details of the derivation process are quite different, as are the final results. It can be said that the result obtained with the present specification is physically more natural. The circuit analyzed by Puri et al [NPL 1] is essentially the same as in FIG. 9. However, in NPL 1, capacitance $C_J$ or $C_g$ is not explicitly indicated. Also, in a derivation process, in NPL 1, the Hamiltonian of the classical circuit is not shown. Further, in the quantum system, NPL 1 does not take into account those corresponding to $a_{g+}$ and $a^+_{g+}$ in the present specification. Therefore, in NPL 1, a unitary matrix for the transformation to incorporate the interaction between JPOs and a coupler into JPOs is different from the above Equation (4.27) of the present specification.

In an analysis of Puri et al. (NPL 1), there is no correspondence to $g'_+$ in the above Equation (4.42) of the present specification.

In the analysis of Puri et al. (NPL 1), $g^{(4)}$ is to diverge to infinity in a limit where JPOs and a coupler become independent (capacitance $C \rightarrow 0$ between each JPO and the coupler), which is physically wrong. $C \rightarrow 0$ is to be a limit where the approximation improves, and it is strange that the analysis breaks down here.

$g^{(4)}$ in the above Equation (4.44) becomes $g^{(4)} \rightarrow 0$ at capacitance $C \rightarrow 0$. Therefore, it can be said that there is a leap in the derivation process of Puri et al.

The disclosure of each of PTLs 1 to 3 and NPLs 1 to 3 is incorporated herein by reference thereto. Variations and adjustments of the examples are possible within the scope of the overall disclosure (including the claims) based on the basic technical concept. Various combinations and selections of examples and disclosed elements (including the elements in each of the claims, examples, drawings, etc.) are possible within the scope of the claims of the present application. That is, the present disclosure includes various variations and modifications that could be made by those skilled in the art according to the overall disclosure including the claims and the technical concept.

The invention claimed is:

1. A superconducting quantum circuit comprising:
first to fourth qubits; and
a coupler that couples the first to fourth qubits with a four-body interaction,
wherein the coupler includes:
first and second electrodes arranged opposed to each other; and
a nonlinear element including at least one Josephson junction and bridging the first and second electrodes,
wherein each of the first to fourth qubits includes a resonator including:
a loop circuit with a first superconducting line, a first Josephson junction, a second superconducting line and a second Josephson junction connected in a ring-shape; and
a capacitor connected in parallel to the loop circuit,
wherein the first and second qubits are capacitively coupled to the first electrode of the coupler, and
the third and fourth qubits are capacitively coupled to the second electrode of the coupler, and
wherein a magnitude relationship among a capacitance value C of a capacitive coupling between each of the first to fourth qubits and the coupler, a capacitance value $C_J$ of the capacitor connected in parallel to the loop circuit of each of the first to fourth qubits, and a capacitance value $C_g$ between the first and second electrodes of the coupler is set to $C_J > C_g > C$.

2. The superconducting quantum circuit according to claim 1, wherein a strength of the four-body interaction is expressed with a numerator that includes a fourth power of C and a denominator that includes a product of a square of $C_J$ multiplied by a cube of a sum of $C_g$ and C, and a difference between a resonance angular frequency of the coupler and a resonance angular frequency of each qubit,
by making $C_g$ smaller as compared to $C_J$, the strength of the four-body interaction being set larger.

3. The superconducting quantum circuit according to claim 1, wherein by making C smaller than $C_J$, a two-body interaction between two qubits is weakened.

4. The superconducting quantum circuit according to claim 1, wherein as for a ratio $$\omega_-/\omega = 1 \pm \delta',$$

where $\omega$ is a resonance angular frequency of each of the qubits and $\omega_-$ is a resonance angular frequency of the coupler, $\omega$ is brought closer to $\omega_-$ within a range satisfying $$\delta > \frac{C}{4\sqrt{C_J(C_B + C)}}.$$

5. The superconducting quantum circuit according to claim 1, wherein each of the first to fourth qubits has the resonator terminated with the loop circuit and includes a magnetic flux generator to which a pump signal is fed, the magnetic flux generator generating a magnetic flux that intersects the loop circuit and causing the resonator to perform a parametric oscillation.

6. The superconducting quantum circuit according to claim 1, wherein in each of the first to fourth qubits,
the second superconducting line of the loop circuit is connected to ground,
the first superconducting line side of the loop circuit is connected to a waveguide, and
the capacitor connected in parallel to the loop circuit includes a stray capacitance between the waveguide and ground, wherein
the waveguide of each of the first and second qubits has an end thereof capacitively coupled to the first electrode of the coupler, and
the waveguide of each of the third and fourth qubits has an end thereof capacitively coupled to the second electrode of the coupler.

7. The superconducting quantum circuit according to claim 1, wherein in the coupler, the nonlinear element includes a loop circuit, in which, a first superconducting line, a first Josephson junction, a second superconducting line and a second Josephson junction are connected in a ring-shape.

8. The superconducting quantum circuit according to claim 1, wherein the first to fourth qubits configured as Josephson parametric oscillators and the coupler constitute a unit structure in a quantum computer.

9. The superconducting quantum circuit according to claim 8, comprising a plurality of the unit structures, wherein a quantum computer is configured to have at least one qubit among the first to fourth qubits constituting the unit structure shared by one or a plurality of other unit structures.

10. The superconducting quantum circuit according to claim 6, wherein the first electrode of the coupler includes first and second opposing portions extended toward the first and second qubits, respectively, the first and second opposing portions having portions opposed to ends of the waveguides of the first and second qubits, for capacitive coupling therewith, respectively, and the second electrode of the coupler includes third and fourth opposing portions extended toward third and fourth qubit, respectively, ends of the third and fourth opposing portions having portions opposed to ends of the waveguides of the third and fourth qubits, for capacitive coupling therewith, respectively.

11. The superconducting quantum circuit according to claim 10, wherein the first electrode other than the first and second opposing portions capacitively coupled with the first and second qubits and the second electrode other than the third and fourth opposing portions capacitively coupled with the third and fourth qubits each have an edge separated from an opposing edge of a ground plane surrounding the coupler with a gap width of a same order as a size of the coupler.

12. The superconducting quantum circuit according to claim 10, wherein the coupler includes a capacitor structure including a plurality of extension portions extended from the first and the second electrodes to the second and the first electrode sides, respectively, and arranged in a nested manner with a comb-teeth shape.

\* \* \* \* \*